United States Patent
Cheng et al.

(10) Patent No.: US 9,385,240 B1
(45) Date of Patent: Jul. 5, 2016

(54) MEMORY DEVICE AND METHOD FOR FABRICATING THE SAME

(71) Applicant: MACRONIX International Co., Ltd., Hsinchu (TW)

(72) Inventors: Chih-Chieh Cheng, Hsinchu (TW); Shih-Guei Yan, Hsinchu (TW); Wen-Jer Tsai, Hsinchu (TW); Nan-Heng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/637,082

(22) Filed: Mar. 3, 2015

(51) Int. Cl.
*H01L 21/8239* (2006.01)
*H01L 27/105* (2006.01)
*H01L 29/792* (2006.01)
*H01L 27/115* (2006.01)
*H01L 21/266* (2006.01)
*H01L 23/528* (2006.01)

(52) U.S. Cl.
CPC .......... *H01L 29/7926* (2013.01); *H01L 21/266* (2013.01); *H01L 23/528* (2013.01); *H01L 27/11568* (2013.01)

(58) Field of Classification Search
CPC .............. H01L 27/11582; H01L 27/11556; H01L 21/8239; H01L 21/8221; H01L 27/1157; H01L 27/11575; H01L 29/7926; H01L 27/11568; H01L 21/266; H01L 23/528
See application file for complete search history.

(56) References Cited

U.S. PATENT DOCUMENTS

| 8,183,625 B2 * | 5/2012 | Forbes | H01L 21/28211 257/326 |
| 2003/0001213 A1 * | 1/2003 | Lai | H01L 27/11556 257/390 |
| 2006/0043457 A1 | 3/2006 | Baik | |
| 2007/0045709 A1 * | 3/2007 | Yang | H01L 27/115 257/315 |
| 2009/0294833 A1 * | 12/2009 | Kim | H01L 21/8221 257/324 |
| 2012/0307568 A1 * | 12/2012 | Banna | H01L 27/11565 365/185.28 |

FOREIGN PATENT DOCUMENTS

TW 200713519 4/2007

OTHER PUBLICATIONS

Office Action of Taiwan Counterpart Application, issued on Feb. 18, 2016, p. 1-p. 5.

* cited by examiner

*Primary Examiner* — Jerome Jackson, Jr.
*Assistant Examiner* — Paul Budd
(74) *Attorney, Agent, or Firm* — J.C. Patents

(57) ABSTRACT

A memory device includes a substrate, a first doped region, composite structures, word lines, and a charge storage layer. The first doped region is disposed on a surface of the substrate. The composite structures are disposed on the first doped region. Each composite structure includes two semiconductor fin structures and a dielectric layer. Each semiconductor fin structure includes a second doped region disposed at an upper portion of the semiconductor fin structure and a body region disposed between the second doped region and the first doped region. The dielectric layer is disposed between the semiconductor fin structures. The word lines are disposed on the substrate. Each word line covers a partial sidewall and a partial top of each composite structure. The charge storage layer is disposed between the composite structures and the word lines.

15 Claims, 21 Drawing Sheets

MEMORY DEVICE AND METHOD FOR FABRICATING THE SAME

BACKGROUND OF THE INVENTION

1. Field of the Invention

The invention relates to a semiconductor device and a method of fabricating the same, and more particularly relates to a memory device and a method of fabricating the same.

2. Description of Related Art

A non-volatile memory can repeatedly perform operations of data writing, reading, and erasing, and is advantageous in that the data stored therein does not disappear even if the power supply is shut down. For this reason, the non-volatile memory has been used as the memory device necessary for various electronic products for maintaining normal operation when power is on.

However, due to the decreasing sizes of semiconductor devices, the short channel effect of the traditional horizontal memory device becomes worse. This effect will lead to the deterioration of the second bit effect and program disturbance in the memory device. In order to avoid these problems, vertical memory devices have been developed and introduced in the recent years, wherein the channel length remains unchanged while the size is reduced, so as to prevent the short channel effect and improve the second bit effect and program disturbance.

Nevertheless, in the conventional vertical memory device, the double-gate structure may easily cause the second bit effect as mentioned above. Therefore, how to improve the second bit effect without sacrificing the operational performance of the vertical memory device is an issue that needs to be overcome.

SUMMARY OF THE INVENTION

The invention provides a memory device and a method of fabricating the same for improving the second bit effect of a vertical memory device and maintaining the operational performance.

The invention provides a memory device, which includes a substrate, a first doped region, a plurality of composite structures, a plurality of word lines, and a charge storage layer. The first doped region is disposed on a surface of the substrate. The composite structures are disposed on the first doped region. Each of the composite structures includes two semiconductor fin structures and a dielectric layer. The dielectric layer is disposed between the semiconductor fin structures. The word lines are disposed on the substrate. Each of the word lines covers a portion of a sidewall and a portion of a top of each composite structure. The charge storage layer is disposed between the composite structures and the word lines.

In an embodiment of the invention, the charge storage layer is disposed on a side of each of the semiconductor fin structures.

In an embodiment of the invention, the first doped region further extends to each of the semiconductor fin structures.

In an embodiment of the invention, the memory device further includes a first barrier layer and a second barrier layer. The first barrier layer is disposed between the second doped region and the body region. The second barrier layer is disposed between the body region and the first doped region.

In an embodiment of the invention, the memory device further includes a plurality of first contacts and a plurality of second contacts. The first contacts are disposed on a first portion of the substrate, wherein each of the first contacts is electrically connected with the corresponding second doped region. The second contacts are disposed on a second portion of the substrate, wherein each of the second contacts is electrically connected with the first doped region.

In an embodiment of the invention, the first doped region and the second doped region are a first conductivity type, and the body region is a second conductivity type, wherein the first conductivity type and the second conductivity type are different.

In an embodiment of the invention, each of the composite structures extends in a first direction and each of the word lines extends in a second direction, wherein the first direction and the second direction are different.

In an embodiment of the invention, a trench is disposed in the first portion of the substrate, wherein the trench extends in the second direction and exposes a portion of the body regions. A third contact is disposed in the trench and electrically connected with the portion of the body regions exposed by the trench.

The invention provides a fabricating method of a memory device. The fabricating method includes: providing a substrate; forming a plurality of composite structures on the substrate, wherein each of the composite structures includes two semiconductor fin structures and a dielectric layer, and the dielectric layer is disposed between the semiconductor fin structures, wherein each of the semiconductor fin structures includes a second doped region and a body region; forming a first doped region on a surface of the substrate, wherein the first doped region is connected with each of the semiconductor fin structures; forming a plurality of word lines on the substrate, wherein each of the word lines covers a portion of a sidewall and a portion of a top of each of the composite structures; and forming a charge storage layer between the composite structures and the word lines.

In an embodiment of the invention, a method of forming the composite structures includes: forming the semiconductor fin structures on the substrate; forming the dielectric layers on the substrate; and removing a portion of the dielectric layers to form the composite structures.

In an embodiment of the invention, a method of removing the portion of the dielectric layers includes: forming a patterned mask layer to cover a portion of the dielectric layers and a portion of the semiconductor fin structures; and removing the dielectric layers not covered by the patterned mask layer.

In an embodiment of the invention, a method of forming the semiconductor fin structures includes: forming a doped layer on the substrate; and patterning the doped layer and the substrate to form the semiconductor fin structures.

In an embodiment of the invention, the fabricating method further includes: forming a hard mask layer on the doped layer and forming a patterned mask layer on the hard mask layer before patterning the doped layer and the substrate; and patterning the hard mask layer, the doped layer, and the substrate with the patterned mask layer as a mask to form a plurality of patterned hard mask layers, a plurality of second doped regions, and a plurality of body regions.

In an embodiment of the invention, a method of forming the first doped region includes: performing an ion implantation process on the substrate with the patterned hard mask layers as masks to implant a dopant in the substrate and form the first doped region.

In an embodiment of the invention, the fabricating method further includes: forming a plurality of first contacts on a first portion of the substrate, wherein each of the first contacts is electrically connected with the corresponding second doped region; and forming a plurality of second contacts on a second portion of the substrate, wherein each of the second contacts is electrically connected with the first doped region.

In an embodiment of the invention, the fabricating method further includes: forming a plurality of isolation structures in the second portion of the substrate; and forming a third doped region in the substrate between the isolation structures, wherein the third doped region is electrically connected with the first doped region, and each of the second contacts is electrically connected with the first doped region through the third doped region.

In an embodiment of the invention, the method of forming the semiconductor fin structures includes: forming a stack layer on the substrate, wherein the stack layer includes a first doped layer, a body layer, and a second doped layer from bottom to top; and patterning the body layer and the second doped region to form the semiconductor fin structures, wherein the first doped layer serves as the first doped region.

In an embodiment of the invention, the stack layer further includes a first barrier layer between the first doped layer and the body layer, and a second barrier layer between the body layer and the second doped layer.

Based on the above, the memory device of the invention includes the composite structure. In the composite structure, the dielectric layer is disposed between two semiconductor fin structures, such that the charge storage layer covering the composite structure is on one side of each semiconductor fin structure. Accordingly, the second bit effect of the vertical memory device is significantly improved to maintain the operational performance. Furthermore, the semiconductor fin structures are electrically connected through the first doped region, so as to facilitate connection between internal elements of the vertical memory device and simplify the fabrication of the vertical memory device.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
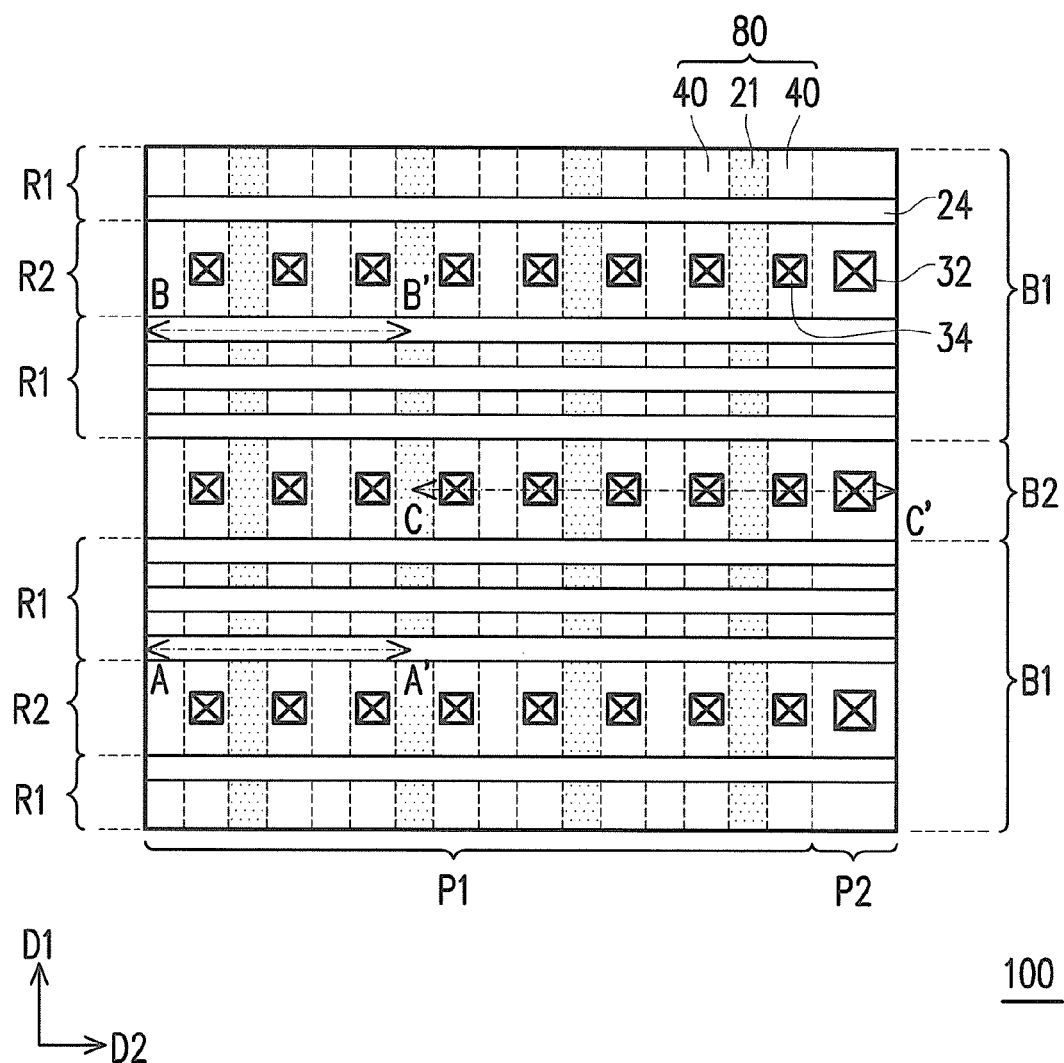
FIG. 1 is a schematic top view of a memory device according to the first embodiment of the invention.
Figure 2:
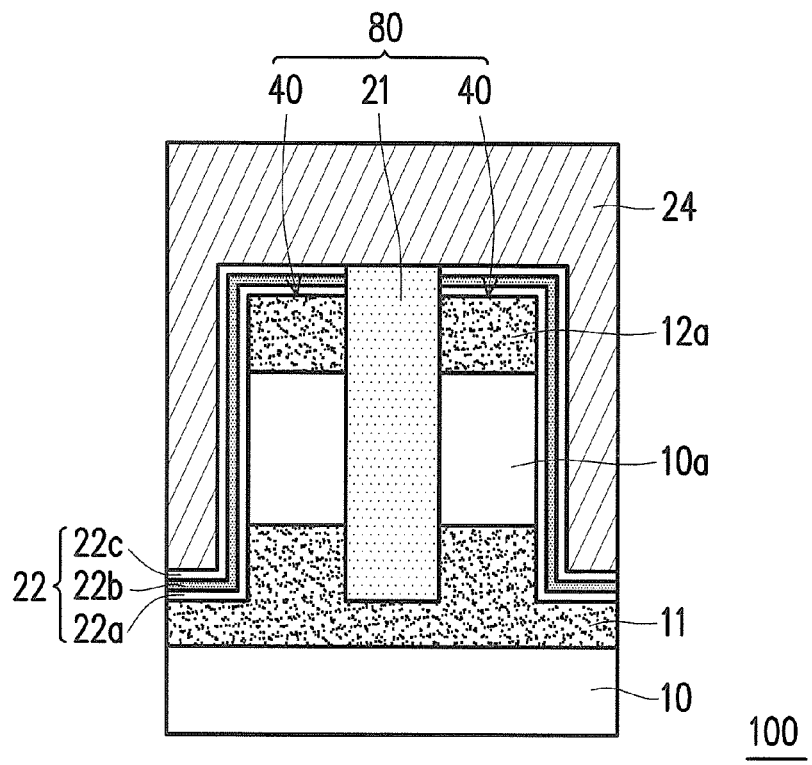
FIG. 2 is a schematic cross-sectional view taken along the line A-A' of FIG. 1 according to the first embodiment of the invention.

FIG. 1 is a schematic top view of a memory device according to the first embodiment of the invention. FIG. 2 is a schematic cross-sectional view taken along the line A-A' of FIG. 1 according to the first embodiment of the invention.

With reference to FIG. 1 and FIG. 2, a memory device 100 includes a substrate 10, a doped region 11, a plurality of composite structures 80, a plurality of word lines 24, and a charge storage layer 22. In FIG. 1, when viewed from a first direction D1, the substrate 10 includes a first portion P1 and a second portion P2. The first portion P1 is an array region of the memory device 100, and the second portion P2 is a peripheral region of an array, for example. When viewed from a second direction D2, the substrate 10 includes a plurality of first blocks B1 and a plurality of second blocks B2. The first blocks B1 and the second blocks B2 are disposed alternately. Each of the first blocks B1 includes two first regions R1 and a second region R2. The second region R2 is located between the first regions R1. The first direction D1 is different from the second direction D2. In an exemplary embodiment, the first direction D1 is substantially perpendicular to the second direction D2.

The substrate 10 is a semiconductor substrate, a semiconductor compound substrate, or a silicon on insulator (SOI) substrate, for example. The substrate 10 may include an ion implantation region, which includes source/drain regions formed by P-type or N-type ion implantation, for example. The substrate 10 may include a single-layer structure or a multi-layer structure. The substrate 10 includes a shallow trench isolation (STI) structure, for example. In an embodiment, the substrate 10 is a silicon substrate or a doped polysilicon, for example.

The doped region 11 is disposed on a surface of the substrate 10. The doped region 11 may be a first conductivity type, which is N type, for example. A dopant of the doped region 11 is phosphorus or arsenic, for example. The thickness of the doped region 11 is in a range of 20-200 nanometers, for example.

The composite structures 80 are disposed on the doped region 11. Each of the composite structures 80 extends in the first direction D1. Each of the composite structures 80 includes two semiconductor fin structures 40 and a dielectric layer 21. In an embodiment, each of the semiconductor fin structures 40 includes a doped region 12a and a body region 10a. In another embodiment, a portion of the doped region 11 extends to a lower portion of each of the composite structures 80. In other words, each of the semiconductor fin structures 40 may include the doped region 12a, the body region 10a, and a portion of the doped region 11. The doped region 12a is located at an upper portion of each of the semiconductor fin structures 40. The body region 10a is disposed between the doped region 12a and the doped region 11. The doped region 11/the body region 10a/the doped region 12a serve as a source/a body/a drain of the memory device 100, for example. The doped region 12a may be the first conductivity type; and the body region 10a may be a second conductivity type. The doped region 11/the body region 10a/the doped region 12a are N+/P/N+ doped regions or P+/N/P+ doped regions, for example. In addition, the doped region 11 and the doped region 12a may have the same or different doping concentrations; and the body region 10a may be doped or not. In an embodiment, a doping concentration of the body region 10a is smaller than the doping concentrations of the doped region 11 and the doped region 12a, for example. In another embodiment, the thickness of the body region 10a is larger than the thickness of the doped region 11 and the doped region 12a, for example. The thickness of the body region 10a is in a range of 30-500 nanometers, for example. The thickness of the doped region 12a is in a range of 20-200 nanometers, for example. In each of the composite structures 80, the dielectric layer 21 is disposed between the two semiconductor fin structures 40, for example. The dielectric layer 21 is disposed for electrically isolating the two semiconductor fin structures 40, for example. A material of the dielectric layer 21 includes an oxide, a nitride, an oxynitride, or a combination of the foregoing, for example. In an embodiment, the width of the semiconductor fin structure 40 is in a range of 30-60 nanometers; and the width of the dielectric layer 21 is in a range of 5-40 nanometers, for example.

With reference to FIG. 1 and FIG. 2 again, a plurality of word lines 24 extend in the second direction D2 and are located in the first regions R1 of the substrate 10. Each of the word lines 24 covers a portion of a sidewall and a portion of a top of each of the composite structures 80. A material of the word line 24 includes N+ doped polysilicon, P+ doped polysilicon, a metal material (e.g., metal silicide, ruthenium, molybdenum, or tungsten), or a combination of the foregoing, for example.

Figure 6:
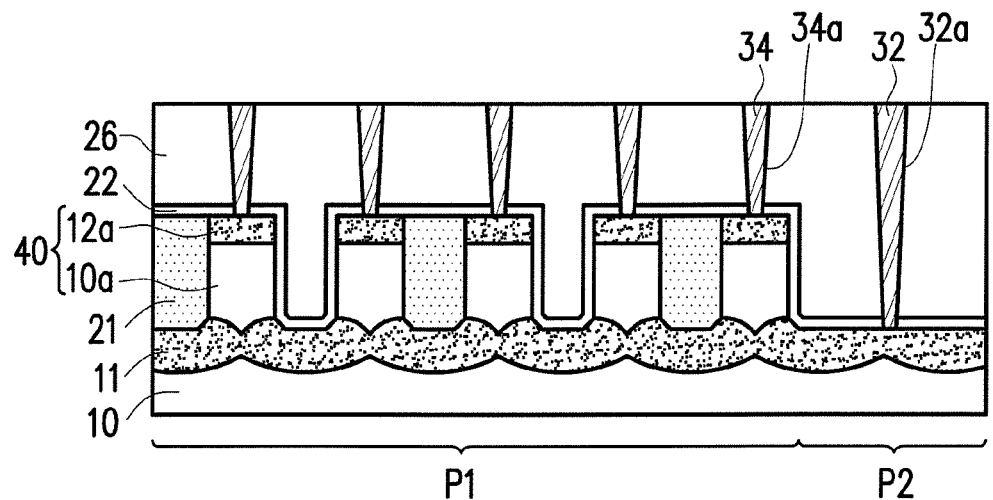
FIG. 6 is a schematic cross-sectional view taken along the line C-C' of FIG. 1 according to the first embodiment of the invention.

The charge storage layer 22 is disposed between the composite structure 80 and the word line 24. The charge storage layer 22 may include a plurality of parts, which are respectively disposed at least on a side of each of the semiconductor fin structures 40, for example. In an embodiment, each part of the charge storage layer 22 conformally covers a portion of the sidewall and the top of the semiconductor fin structure 40 of the composite structure 80 and a surface of the doped region 11, but does not cover the dielectric layer 21, as shown in FIG. 2. In another embodiment, a part of the charge storage layer 22 conformally covers a portion of the sidewall and the top of the semiconductor fin structure 40 of the composite structure 80 and the surface of the doped region 11, while another part covers the dielectric layer 21 to be connected to form one single material layer, as shown in FIG. 6. The charge storage layer 22 is a floating gate, a charge trapping layer, or a nano-crystal, for example. In an embodiment, the charge storage layer 22 is a composite layer composed of an oxide layer 22a/a nitride layer 22b/an oxide layer 22c (Oxide-Nitride-Oxide, ONO), for example. The composite layer may include three layers or more. A material of the charge storage layer 22 includes silicon oxide, silicon nitride, or a combination of the foregoing. The charge storage layer 22 not only has a function of storing charges but also has a function of electrically isolating the doped region 12a, the doped region 11, and the word lines 24.

Each of the semiconductor fin structures 40 is disposed between the charge storage layer 22 and the dielectric layer 21, for example. In an embodiment of the invention, when the device is in operation, carriers in the doped region 12a (serving as the drain, for example) on a side close to the charge storage layer 22 are injected into the charge storage layer 22 nearby due to a bias of the word line 24 (serving as the gate, for example); and charge carriers in the doped region 12a (serving as the drain, for example) on a side close to the dielectric layer 21 penetrate into the doped region 11 (serving as the source, for example) from the doped region 12a (serving as the drain, for example). Accordingly, mutual influence between two bits of the same memory cell is prevented to improve the second bit effect of the memory device.

With reference to FIG. 1 again, the memory device 100 further includes a plurality of first contacts 34 and a plurality of second contacts 32. The first contacts 34 are disposed on the first portion P1 of the substrate 10; and the second contacts 32 are disposed on the second portion P2 of the substrate 10. In an embodiment, the second contacts 32 and the first contacts 34 are disposed in the second regions R2 of the substrate 10, for example. Each of the first contacts 34 is electrically connected with the doped region 12a of the corresponding semiconductor fin structure 40. Each of the second contacts 32 is electrically connected with the doped region 11. A material of the second contacts 32 and the first contacts 34 includes aluminum, copper, or an alloy thereof, for example.

It should be noted that, because each of the semiconductor fin structures 40 included in the composite structure 80 is disposed on the doped region 11, when the doped region 11 serves as the source of the memory device, for example, the sources of the semiconductor fin structures 40 are electrically connected with each other. Accordingly, the connection between internal elements of the vertical memory device is facilitated to significantly simplify the relative relationship between vertical memory devices and the configuration of the stack structure.

Figure 3:
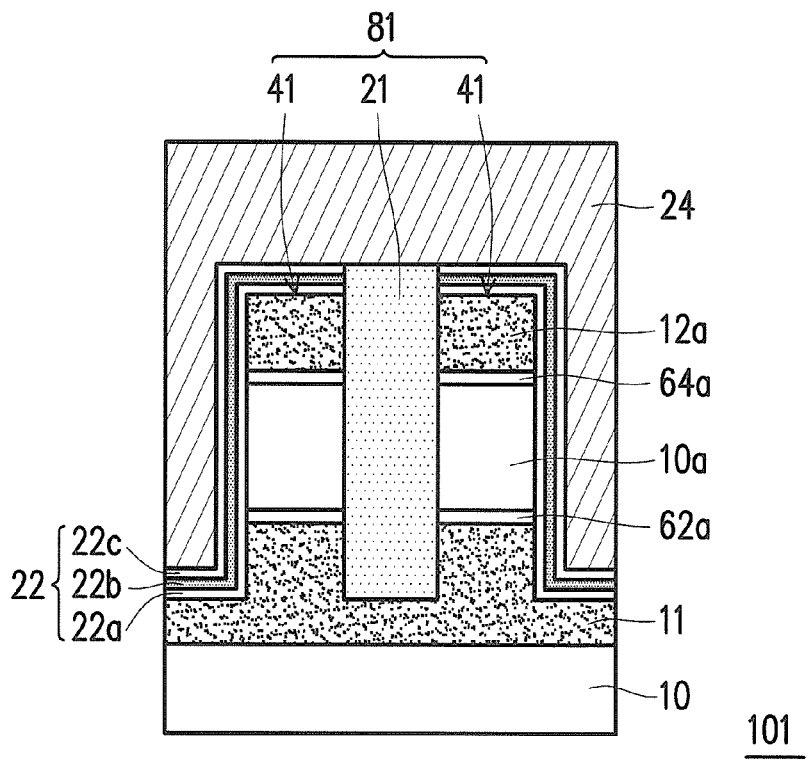
FIG. 3 is a schematic cross-sectional view of a memory device according to another embodiment of the invention.

FIG. 3 is a schematic cross-sectional view of a memory device according to another embodiment of the invention.

With reference to FIG. 3, a composite structure 81 of a memory device 101 is similar to the composite structure 80 of the memory device 100, and a difference therebetween lies in that each semiconductor fin structure 41 of the memory device 101 further includes a barrier layer 64a and a barrier layer 62a. The barrier layer 62a is disposed between the body region 10a and the doped region 11; and the barrier layer 64a is disposed between the body region 10a and the doped region 12a. In an embodiment, a material of the barrier layer 62a and the barrier layer 64a includes an oxide, a nitride, an oxynitride, or a combination of the foregoing. The barrier layer 62a and the barrier layer 64a may be formed of the same or different materials. In this embodiment, the barrier layer 62a and the barrier layer 64a are disposed between the two doped regions 11 and 12a to block the dopants in the doped regions 11 and 12a from diffusing. Therefore, the thickness of the barrier layer 62a and the barrier layer 64a is sufficient to prevent the dopants in the doped region 11, the body region 10a, and the doped region 12a from diffusing but allows the charge carrier (e.g., electron or hole) to tunnel easily.

Figure 4:
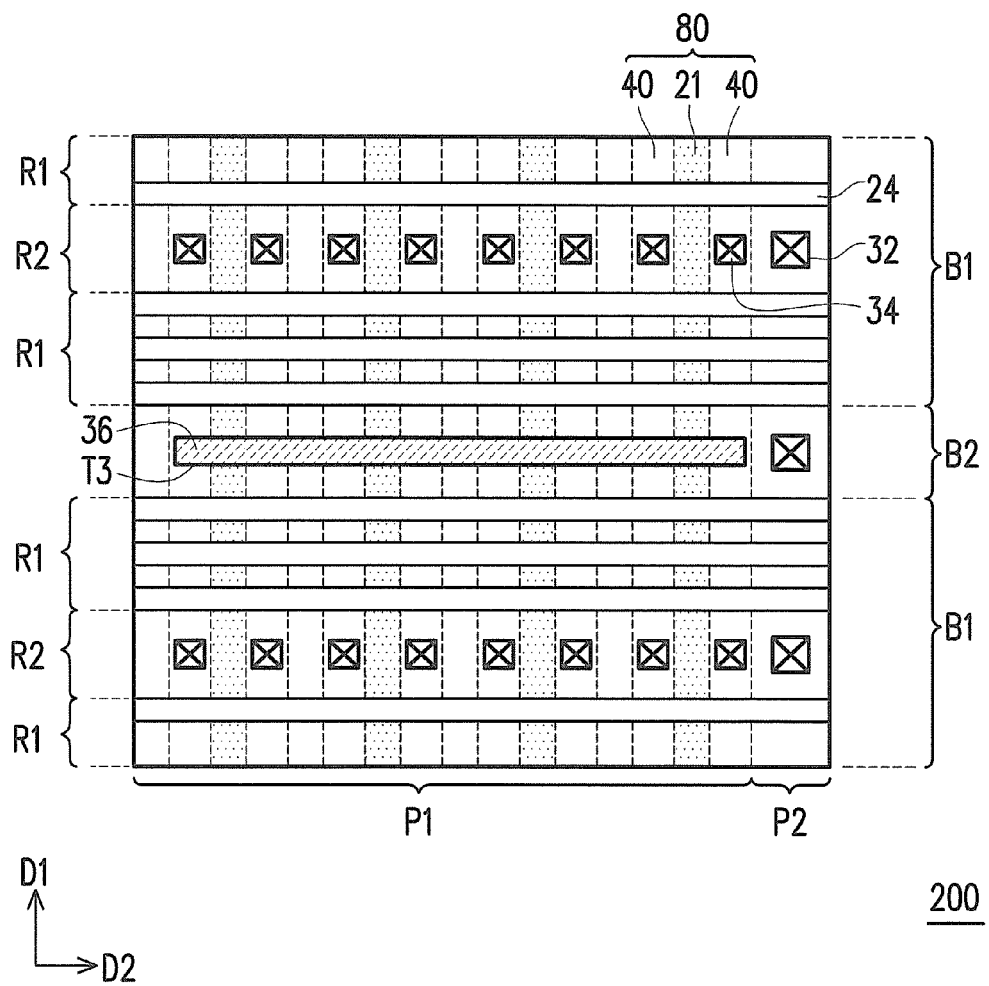
FIG. 4 is a schematic top view of a memory device according to the second embodiment of the invention.

FIG. 4 is a schematic top view of a memory device according to the second embodiment of the invention. It should be noted that a difference between a memory device 200 of FIG. 4 and the memory device 100 of FIG. 1 lies in that the first portion P1 of the substrate 10 of the memory device 200 further includes a third contact 36.

With reference to FIG. 4, the memory device 200 is similar to the memory device 100, and a difference therebetween lies in that the memory device 200 further includes the third contact 36. Details of the composite structure 80, the word lines 24, the second contact 32, and the first contact 34 have been specified above (as those of the memory device 100) and thus are not repeated hereinafter.

The third contact 36 is disposed in a trench T3. The trench T3 is disposed in the first portion P1 of the substrate 10. In an embodiment, the trench T3 is disposed in the second block B2 of the substrate 10, for example. The trench T3 extends in the second direction D2, for example. Moreover, the trench T3 exposes the body region 10a (not shown) of the corresponding semiconductor fin structure 40. In other words, in the first block B1, the body region 10a is disposed between the doped region 12a and the doped region 11; and in the second block B2, the body region 10a is disposed on the doped region 11, and the trench T3 exposes the body region 10a.

The third contact 36 is disposed in the trench T3. The third contact 36 is disposed in the second block B2 and extends in the second direction D2. A material of the third contact 36 includes aluminum, copper, or an alloy thereof, for example. In this embodiment, the third contact 36 is electrically connected with the body regions 10a exposed by the trench T3.

It should be noted that the third contact 36 is electrically connected with the body regions 10a of the semiconductor fin structures 40. In other words, the body regions 10a of the semiconductor fin structures 40 are electrically connected with each other through the third contact 36. Thus, when the body region 10a is used as the body of the memory device, for example, a voltage can be applied to the body through a wire, which is subsequently formed on the third contact 36, for controlling a potential of the body. Accordingly, the potential of the body can be obtained to prevent the potential of the body from becoming a floating state due to a coupling effect of other bias.

FIG. 5A to FIG. 5I are schematic cross-sectional views taken along the line B-B' of FIG. 1, illustrating a fabricating method of the memory device. Components the same as those of the memory device 100 of FIG. 1 are marked with the same reference numerals in the following embodiments. Materials of the components and the relative relationship between neighboring components have been specified in the embodiment of the memory device 100 and thus are not repeated hereinafter.

Figure 5A:
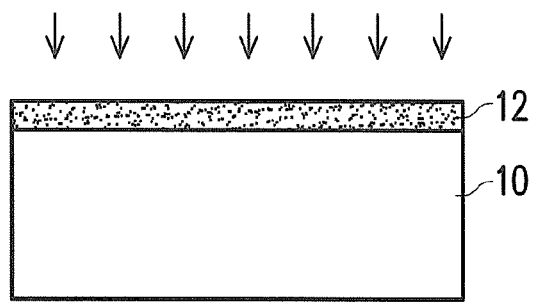
FIG. 5A to FIG. 5I are schematic cross-sectional views taken along the line B-B' of FIG. 1, illustrating a fabricating method of the memory device.

With reference to FIG. 1 and FIG. 5A, a substrate 10 is provided. Next, a doped layer 12 is formed on the substrate 10. The doped layer 12 may be the first conductivity type, which is N type, for example. A method of forming the doped layer 12 includes implanting a dopant into a surface of the substrate 10 by performing an ion implantation process on the substrate 10, for example. The dopant of the doped layer 12 is phosphorus or arsenic, and a dopant dose thereof is in a range of $1\times10^{13}/cm^2$ to $1\times10^{14}/cm^2$, for example.

Figure 5B:
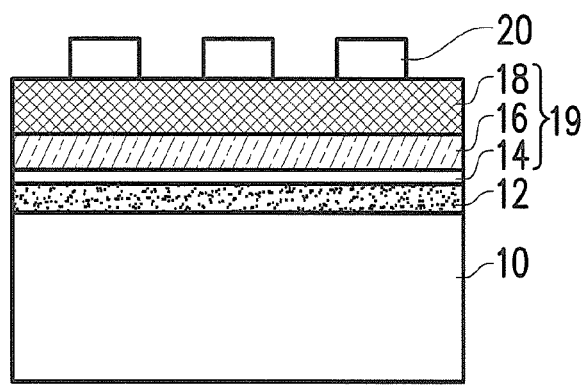

With reference to FIG. 5B, a hard mask layer 19 is formed on the doped layer 12. The hard mask layer 19 may be a single layer or include multiple layers. A material of the hard mask layer 19 includes silicon oxide, silicon nitride, an advanced patterning film (APF), or a combination of the foregoing. In an embodiment, the hard mask layer 19 may include an oxide layer 14, a nitride layer 16, and an advanced patterning film layer 18. A method of forming the hard mask layer 19 includes forming the oxide layer 14, the nitride layer 16, and the advanced patterning film layer 18 in sequence on the doped layer 12 by chemical vapor deposition, for example. In another embodiment, the hard mask layer 19 may include any two of the aforementioned three layers. Then, a patterned mask layer 20 is formed on the hard mask layer 19. A material of the mask layer 20 is a photoresist, for example.

Figure 5C:
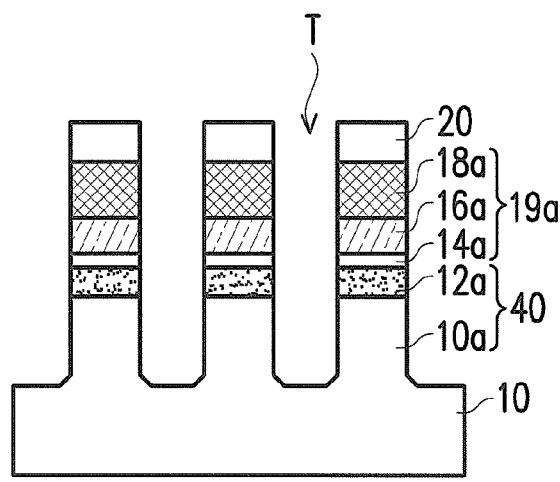

With reference to FIG. 5C, an etching process is performed on the hard mask layer 19, the doped layer 12, and the substrate 10 with the patterned mask layer 20 as a mask, so that a plurality of patterned hard mask layers 19a, a plurality of doped regions 12a, a plurality of body regions 10a, and a plurality of trenches T are formed. The etching process is anisotropic etching, such as dry etching, for example. The dry etching may be plasma etching, reactive ion etching, etc. In an embodiment, the patterned hard mask layer 19a includes a patterned oxide layer 14a, a patterned nitride layer 16a, and a patterned advanced patterning film layer 18a. Moreover, the doped region 12a and the body region 10a under each patterned hard mask layer 19a constitute the semiconductor fin structure 40.

The depth of the trench T is in a range of 1500 angstroms to 6000 angstroms, for example. In an embodiment, a sidewall of the trench T is perpendicular to a bottom surface thereof, for example, so as to prevent implanting the dopant into the body region 10a when performing a subsequent ion implantation process on a bottom portion of the trench T. Moreover, two bottom corners of the trench T are right angles, chamfer angles, or round angles, for example. In an embodiment, the two bottom corners of the trench T are chamfer angles or round angles, for example, so as to facilitate diffusion of the dopant in the bottom portion of the trench T when performing the subsequent ion implantation process. Nevertheless, the invention is not limited thereto.

Figure 5D:
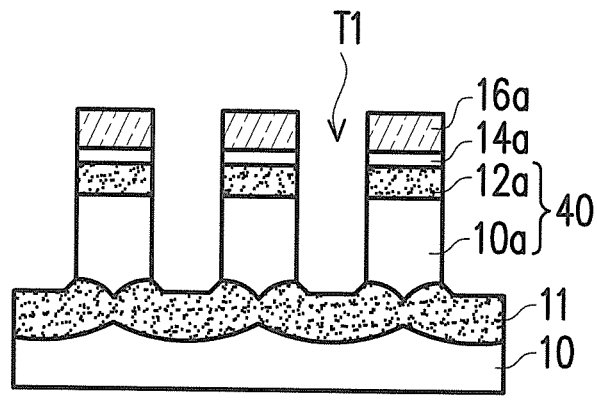

Thereafter, with reference to FIG. 5C and FIG. 5D, the patterned mask layer 20 and the patterned advanced patterning film layer 18a are removed. At the same time, a plurality of trenches T1 are exposed. A method of removing the patterned mask layer 20 and the patterned advanced patterning film layer 18a includes performing a dry or wet stripping/etching process, for example.

Then, an ion implantation process is performed on the substrate 10 with the patterned nitride layer 16a as a mask, so that the dopant is implanted into the substrate 10 of the bottom portion of the trench T1 to form a doped region 11. The doped region 11 may be the first conductivity type, which is N type, for example. The dopant of the doped region 11 is phosphorus or arsenic, and a dopant dose thereof is in a range of $1 \times 10^{13}/\text{cm}^2$ to $1 \times 10^{14}/\text{cm}^2$, for example. In an embodiment, because the patterned nitride layer 16a disposed above the doped region 12a blocks diffusion of the dopant in the doped region 12a while forming the doped region 11 by the ion implantation process, the doping concentrations of the doped region 11 and the doped region 12a are individually adjustable.

It should be noted that, in an embodiment, because the bottom corners of the trench T1 are chamfer angles or round angles, a diffusion range of the dopant implanted in the doped region 11 is wider, and the dopant further diffuses into the substrate 10 of the bottom portion of the body region 10a, so as to form the doped region 11 in the substrate 10 of the body region 10a and the bottom portion of the trench T1. In another embodiment, a thermal annealing process is performed on the substrate 10 after performing the ion implantation process, so as to diffuse the implanted dopant into the substrate 10 of the bottom portion of the body region 10a. In yet another embodiment, the doped region 11 further extends into the substrate 10 of the second portion P2.

Figure 5E:
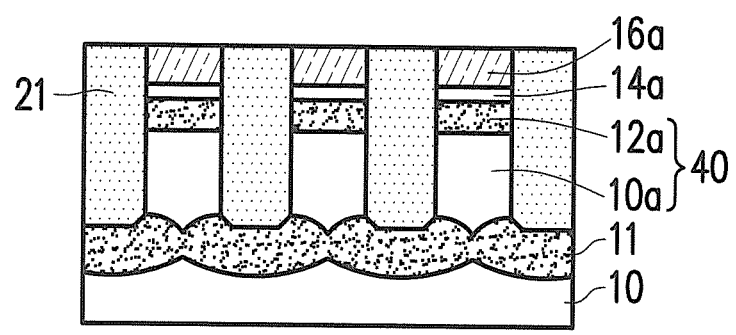

With reference to FIG. 5E, a dielectric layer 21 is formed between the semiconductor fin structures 40. A method of forming the dielectric layer 21 includes forming a dielectric material layer on the substrate 10 by performing thermal oxidation or chemical vapor deposition, for example. Then, the dielectric material layer may be polished to be even with the patterned nitride layer 16a by selectively performing a chemical mechanical polishing (CMP) process.

Thereafter, the patterned nitride layer 16a, the patterned oxide layer 14a, and a portion of the dielectric layer 21 are removed. A method of removing the patterned nitride layer 16a includes using a hot phosphoric acid solution. A method of removing the dielectric layer 21 includes using a buffered oxide etchant (BOE). Alternatively, the patterned nitride layer 16a, the patterned oxide layer 14a, and a portion of the dielectric layer 21 may be removed together by performing a blanket etching process. Nevertheless, the invention is not limited thereto. In an embodiment, the aforementioned step may be omitted.

Figure 5F:
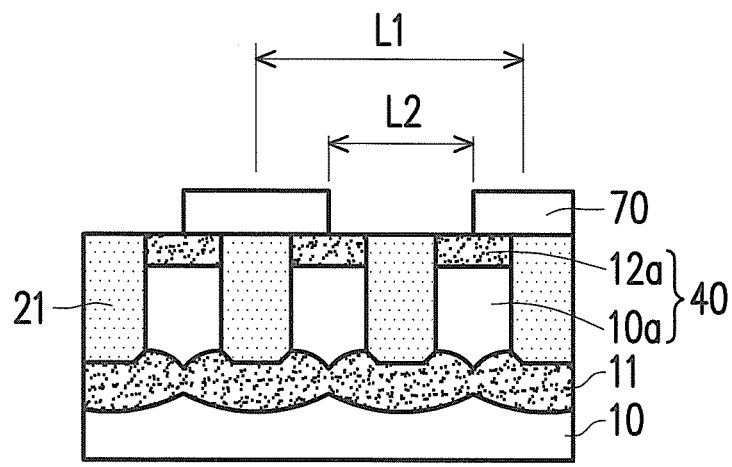
Figure 5G:
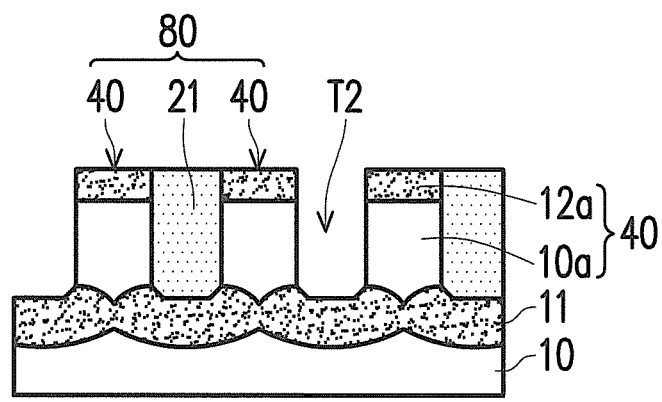

With reference to FIG. 5F and FIG. 5G, a patterned mask layer 70 is formed on the substrate 10. The patterned mask layer 70 covers the dielectric layer 21 between each pair of semiconductor fin structures 40 and a portion of the semiconductor fin structures 40 but exposes the dielectric layer 21 between adjacent pairs of semiconductor fin structures 40. In an embodiment, an interval L1 between the patterned mask layers 70 is twice an interval L2 between the semiconductor fin structures 40, for example. However, the invention is not limited thereto. In another embodiment, a hard mask layer (not shown) may be selectively formed on the substrate 10 before forming the patterned mask layer 70.

Next, the dielectric layer 21 not covered by the patterned mask layer 70 is removed so as to form a plurality of composite structures 80 and a plurality of trenches T2. Each of the composite structures 80 includes two semiconductor fin structures 40 and the dielectric layer 21. Moreover, the dielectric layer 21 is disposed between the two semiconductor fin structures 40. Each of the trenches T2 is disposed between adjacent two composite structures 80. Thereafter, the patterned mask layer 70 is removed.

Figure 5H:
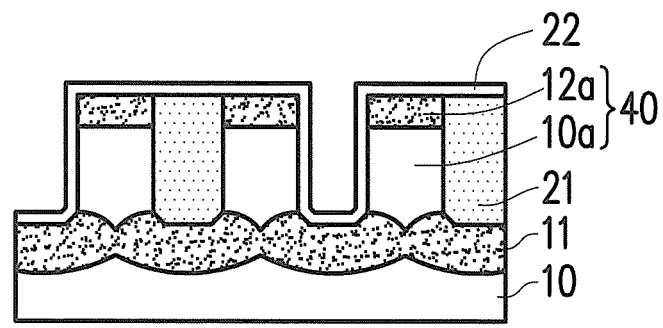

With reference to FIG. 5H, a charge storage layer 22 is formed on the substrate 10. The charge storage layer 22 is formed conformally on a top surface and a side surface of the composite structure 80 and a surface of the doped region 11. A method of forming the charge storage layer 22 includes chemical vapor deposition or thermal oxidation, for example.

Figure 5I:
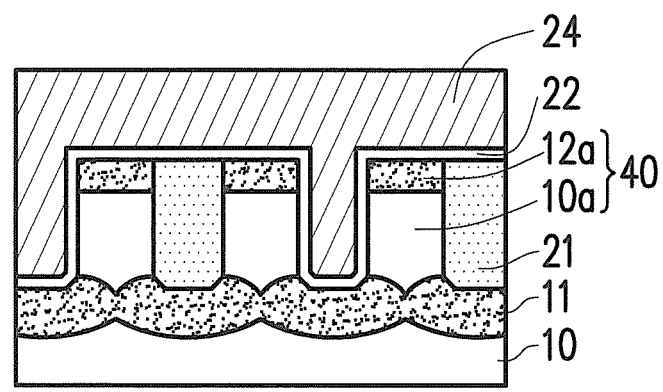

With reference to FIG. 1 and FIG. 5I, word lines 24 are formed on the charge storage layer 22. Each of the word lines 24 extends in the second direction D2 and covers a portion of a sidewall and a portion of a top of each of the composite structures 80. In other words, the charge storage layer 22 is disposed between the composite structures 80 and the word lines 24.

Figure 7:
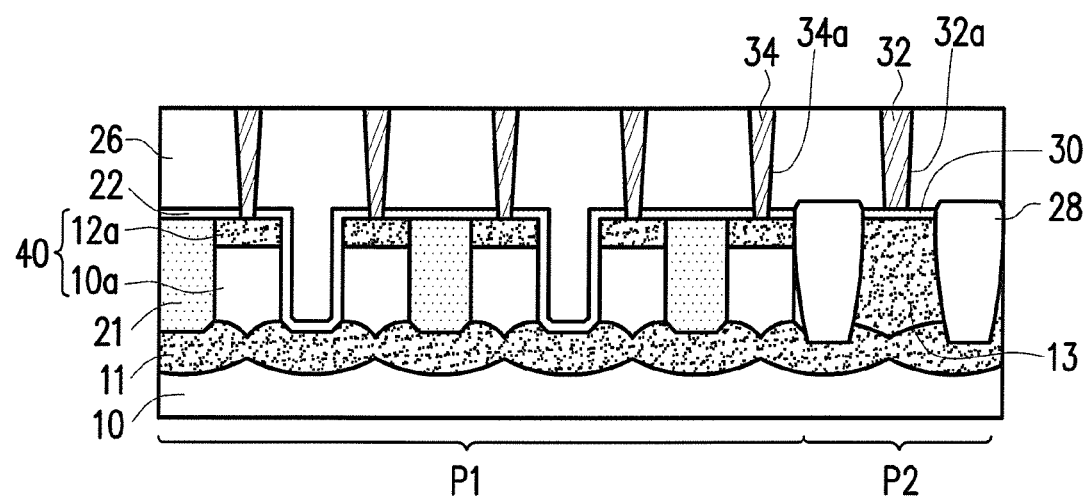
FIG. 7 is a schematic cross-sectional view taken along the line C-C' of FIG. 1 according to another embodiment of the invention.

FIG. 6 is a schematic cross-sectional view taken along the line C-C of FIG. 1 according to the first embodiment of the invention. FIG. 7 is a schematic cross-sectional view taken along the line C-C' of FIG. 1 according to another embodiment of the invention.

With reference to FIG. 6, after forming the word lines 24, a dielectric layer 26 is formed on the substrate 10. Then, a portion of the dielectric layer 26 and a portion of the charge storage layer 22 are removed by performing a lithographic and etching process, so as to form a plurality of contact holes 32a in the substrate 10 of the second portion P2. Meanwhile, a plurality of contact holes 34a are formed in the substrate 10 of the first portion P1. A bottom of each of the contact holes 32a exposes the doped region 11. A bottom of each of the contact holes 34a exposes the doped region 12a of the semiconductor fin structure 40.

Thereafter, first contacts 34 and second contacts 32 are formed in the contact holes 34a and the contact holes 32a respectively. Each of the first contacts 34 is electrically connected with the doped region 12a of the corresponding semiconductor fin structure 40. Each of the second contacts 32 is electrically connected with the doped region 11. A method of forming the first contacts 34 and the second contacts 32 includes forming a conductor material layer on the substrate 10 first, for example. The conductor material layer is aluminum, copper, or an alloy thereof, for example. A method of forming the conductor material layer includes physical vapor deposition, such as sputtering, for example. Then, the conductor material layer outside the contact holes 34a and the contact holes 32a is removed by chemical mechanical polishing or etching back.

With reference to FIG. 7, in another embodiment, before forming the dielectric layer 26, a plurality of isolation structures 28 are formed in the second portion P2 of the substrate 10. The isolation structure 28 is a shallow trench isolation (STI) region, for example. Then, a doped region 13 is formed in the substrate 10 between the isolation structures 28. The doped region 13 is disposed above the doped region 11 and electrically connected with the doped region 11. In an embodiment, the doped regions 11, 12a, and 13 are all the first conductivity type, such as N type, for example. A dopant of the doped region 13 is phosphorus or arsenic, and a dopant dose thereof is in a range of $1 \times 10^{13}/\text{cm}^2$ to $1 \times 10^{14}/\text{cm}^2$, for example. Afterward, a dielectric layer 30 is formed on the substrate 10 of the second portion P2. Next, the dielectric layer 26, the first contacts 34, and the second contacts 32 are formed.

It should be noted that, in this embodiment, each of the second contacts 32 is in contact with the doped region 13 at the bottom, and the doped region 13 is disposed above the doped region 11. Thus, each of the second contacts 32 is electrically connected with the doped region 11 through the doped region 13. In addition, the doped region 11 connects each of the semiconductor fin structures 40. Therefore, each of the second contacts 32 is electrically connected with each of the semiconductor fin structures 40 through the doped region 13 and the doped region 11.

In an embodiment of the invention, the subsequent process includes forming a wire on the second contacts 32 and the first contacts 34, such that the doped region 11 and the doped region 12a are electrically connected with an external component through the wire. However, the invention is not limited thereto.

Figure 8A:
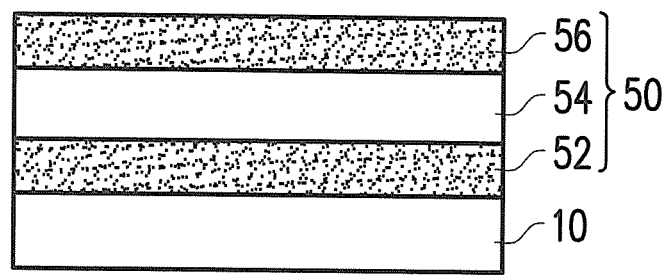
FIG. 8A to FIG. 8B are schematic cross-sectional views illustrating a fabricating method of partial components of a memory device according to yet another embodiment of the invention.
Figure 8B:
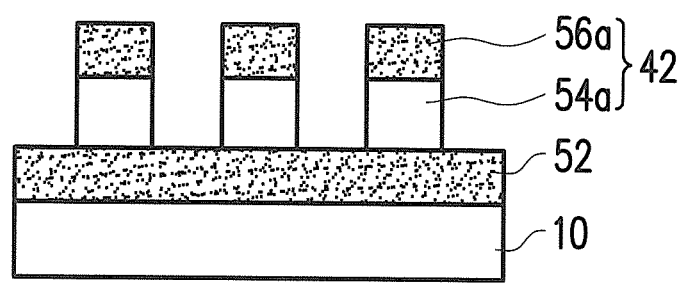
Figure 9A:
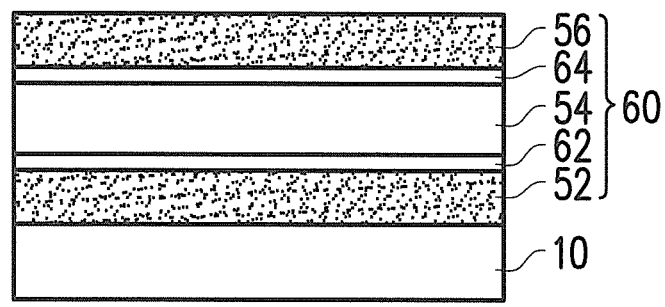
FIG. 9A to FIG. 9B are schematic cross-sectional views illustrating a fabricating method of partial components of a memory device according to yet another embodiment of the invention.
Figure 9B:
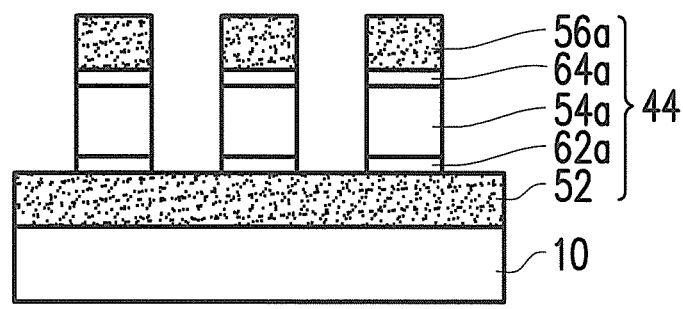

FIG. 8A to FIG. 8B are schematic cross-sectional views illustrating a fabricating method of partial components of a memory device according to another embodiment of the invention. FIG. 9A to FIG. 9B are schematic cross-sectional views illustrating a fabricating method of partial components of a memory device according to yet another embodiment of the invention.

In another embodiment of the invention, the semiconductor fin structures 40 are semiconductor fin structures 42 as shown in FIG. 8B. With reference to FIG. 8A, a method of forming the semiconductor fin structures 42 includes forming a stack layer 50 on the substrate 10, for example. The stack layer 50 includes a doped layer 52, a body layer 54, and a doped layer 56 in sequence from bottom to top. The doped layer 52, the body layer 54, and the doped layer 56 may be formed respectively by chemical vapor deposition or epitaxy.

Next, with reference to FIG. 8B, the body layer 54 and the doped layer 56 are patterned to form the semiconductor fin structures 42 by performing a lithographic and etching process. Each of the semiconductor fin structures 42 includes a body region 54a and a doped region 56a. The doped layer 52 is also called the doped region. The doped layer (doped region) 52/the body region 54a/the doped region 56a serve as a source/a body/a drain, for example. It should be noted that, because the doped layer 52 is not patterned, when serving as the source, the source of each of the semiconductor fin structures 42 is electrically connected with each other.

In yet another embodiment of the invention, the semiconductor fin structures 40 are semiconductor fin structures 44 as shown in FIG. 9B. With reference to FIG. 9A, a method of forming the semiconductor fin structures 44 includes forming a stack layer 60 on the substrate 10 first, for example. The stack layer 60 includes a doped layer 52, a barrier layer 62, a body layer 54, a barrier layer 64, and a doped layer 56 in sequence from bottom to top. A method of forming the barrier layer 62 and the barrier layer 64 includes chemical vapor deposition, for example.

Thereafter, with reference to FIG. 9B, the doped layer 56, the barrier layer 64, the body layer 54, and the barrier layer 62 are patterned to form the semiconductor fin structures 44. Compared with the semiconductor fin structures 42, the semiconductor fin structures 44 further include the patterned barrier layer 62a and the patterned barrier layer 64a.

Figure 10:
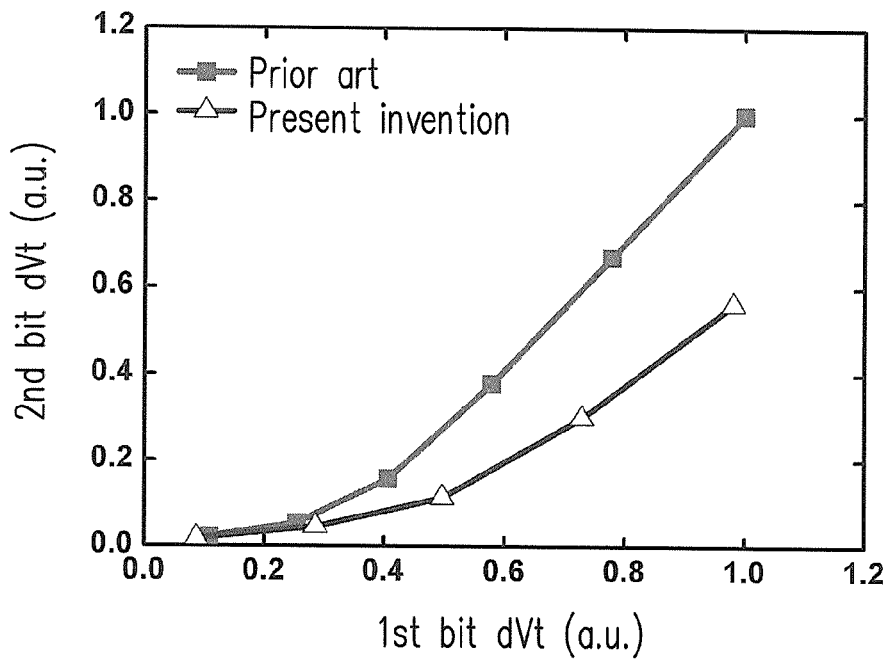
FIG. 10 is a graph showing second bit effects of a conventional memory device and a memory device in an example of the invention.

FIG. 10 is a graph showing the second bit effects of a conventional memory device and a memory device in an example of the invention.

With reference to FIG. 10, the vertical axis represents a second bit delta threshold voltage variation (dVt) and the horizontal axis represents a first bit delta threshold voltage variation. The charge storage layer in the memory device of the invention is disposed on a side of the semiconductor fin structure, and adjacent two semiconductor fin structures are separated by the dielectric layer. Thus, in the semiconductor fin structure, charge carriers on the side close to the dielectric layer penetrate into the source from the drain during operation, so as to prevent two bits of the same memory cell from affecting each other. It is known from FIG. 10 that the second bit effect of the memory device of the invention is 60% of the conventional memory device. Thus, the invention significantly improves the second bit effect of the memory device.

Figure 11:
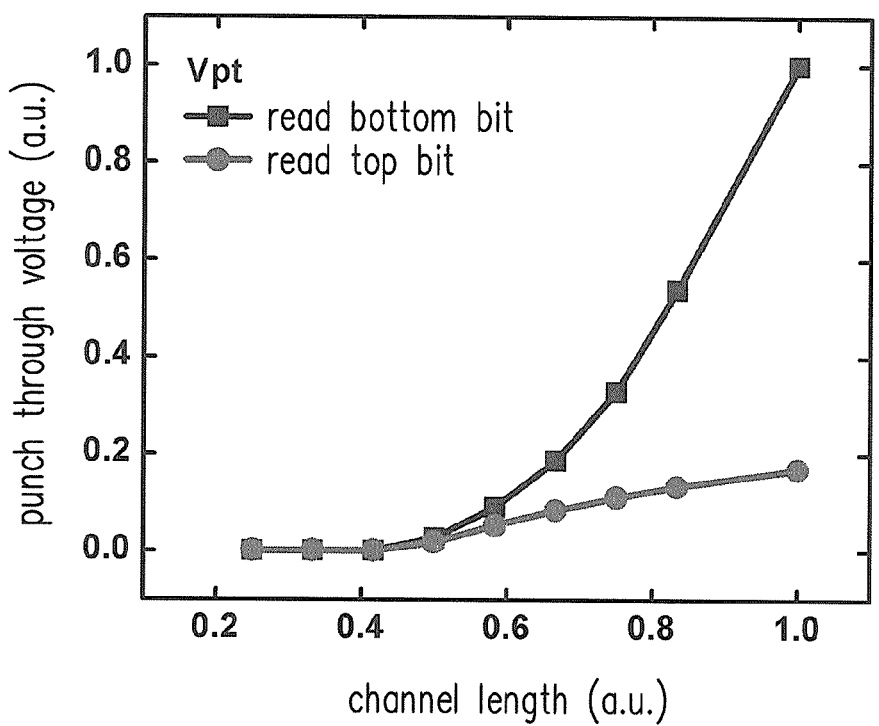
FIG. 11 is a graph showing punch through voltages (Vpt) of reading different bits of a memory device in an example of the invention.
Figure 12:
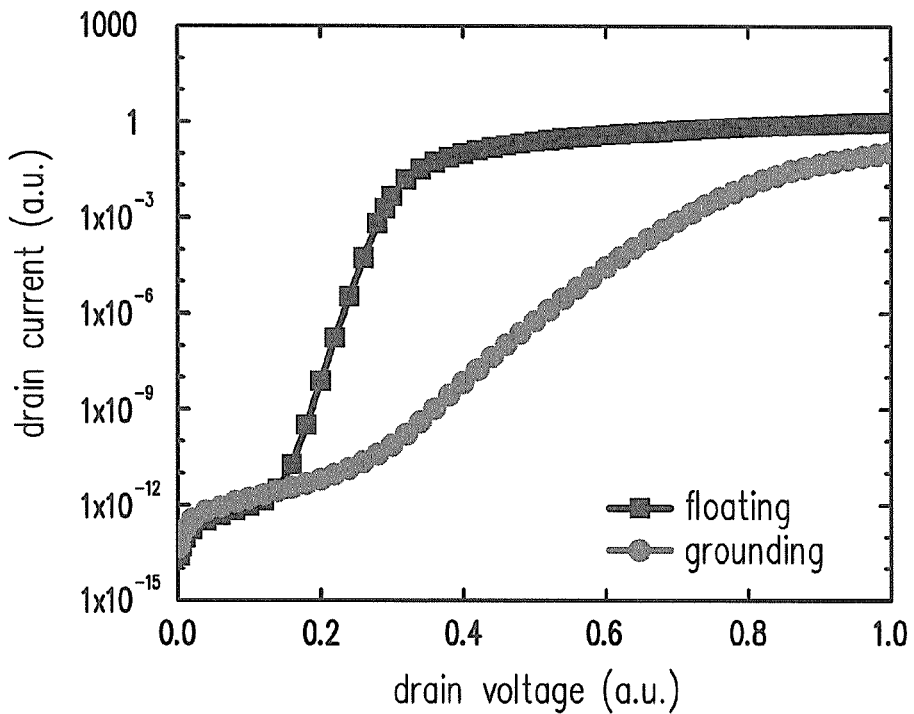
FIG. 12 is a graph showing current variations of a bit line of a memory device in an example of the invention.
Figure 13:
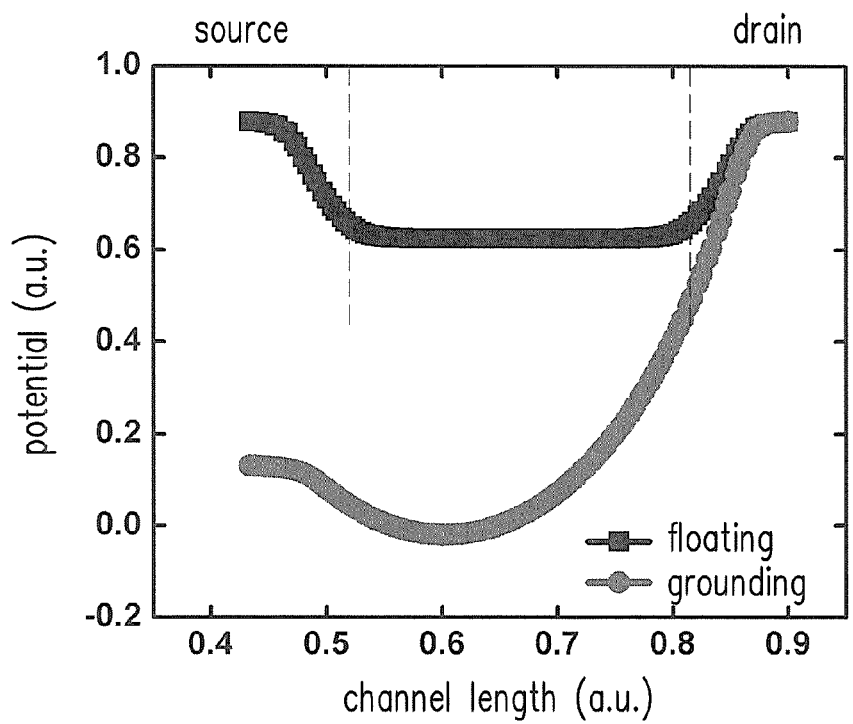
FIG. 13 is a graph showing channel potentials of a memory device in an example of the invention.

FIG. 11 is a graph showing punch through voltages of reading different bits of a memory device in an example of the invention. FIG. 12 is a graph showing current variations of a bit line of a memory device in an example of the invention. FIG. 13 is a graph showing channel potentials of a memory device in an example of the invention.

The memory device in an example of the invention has the composite structure as shown in FIG. 2, which includes two semiconductor fin structures respectively on the left and the right. In this example, different voltages are respectively applied to the source and the drain (a drain voltage $V_d$ is applied to the drain, and a source voltage $V_s=0V$ is applied to the source) for reading a top bit and a bottom bit of the semiconductor fin structure on the left and observing the influence on the current and the channel (e.g., the body region 10a of FIG. 2) potential of the unselected bit line (e.g., the doped region 12a of the semiconductor fin structure on the right of FIG. 2).

With reference to FIG. 11, FIG. 12, and FIG. 13, the vertical axis of FIG. 11 represents the punch through voltage (Vpt), and the horizontal axis represents the channel length (Lg). The two curves in the figure respectively indicate the influence of different channel lengths on the punch through voltage when respectively reading the top bit and the bottom bit of the semiconductor fin structure. FIG. 12 and FIG. 13 represents the current variation and the channel potential of the unselected bit line (floating or grounding state) when reading the top bit.

It is known from FIG. 11 and FIG. 12 that, when the unselected bit line is floating, the punch through voltage of reading the top bit is lower than the punch through voltage of reading the bottom bit. The reason is that, when reading the top bit, the drain voltage $V_d$ applied to a common drain line (e.g., the doped region 11 of FIG. 2) causes the potential of the channel (e.g., the doped region 10a of FIG. 2) under the unselected bit line (e.g., the doped region 12a of FIG. 2) to increase, so as to form an equivalent gate bias and raise the channel potential of the selected bit line, thereby forming a punch through current, as shown in FIG. 13. In contrast thereto, when the unselected bit line is grounding (i.e., 0V), the characteristic of the punch through voltage is significantly improved, as shown in FIG. 12 and FIG. 13.

Figure 14:
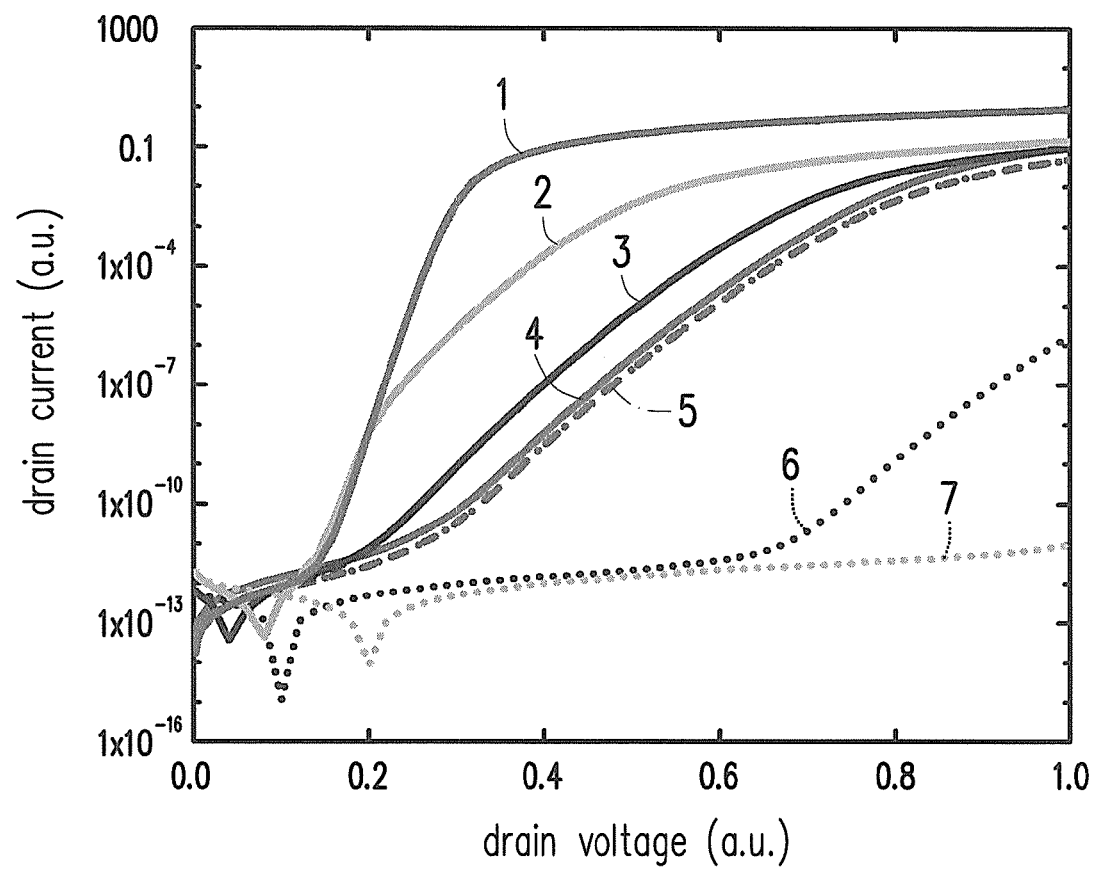
FIG. 14 is a graph showing current variations when different voltages are applied to a memory device in an example of the invention.

FIG. 14 is a graph showing current variations when different voltages are applied to a memory device in an example of the invention.

With reference to FIG. 2 and FIG. 14, in this example, the drain voltage is $V_d$, a source voltage S1 of the selected bit line is equal to 0, and a source voltage S2 of the unselected bit line is floating (F), 0V, 1V, and 2V respectively. The solid lines 1 to 4 of FIG. 14 respectively represent a drain leakage $I_{d1}$ while the source voltages S2 is floating (F), 2V, 1V, and 0V respectively. The dotted lines 5, 6, and 7 respectively represent a leakage $I_{d2}$ of the source voltage S2 when the source voltage S2=0V, S2=1V, and S2=2V.

It is known from the result of FIG. 14 that program disturbance of the unselected bit line is suppressed as the source voltage S2 of the unselected bit line increases, but it results in higher leakage of the source voltage S1 of the selected bit line. Lower source voltage S2 of the unselected bit line suppresses the leakage of the source voltage S1 of the selected bit line but causes program disturbance of the unselected bit line. Therefore, to program the bottom bit, the source voltage S2 of the unselected bit line is set to 1V-2V in a preferred embodiment.

Figure 15:
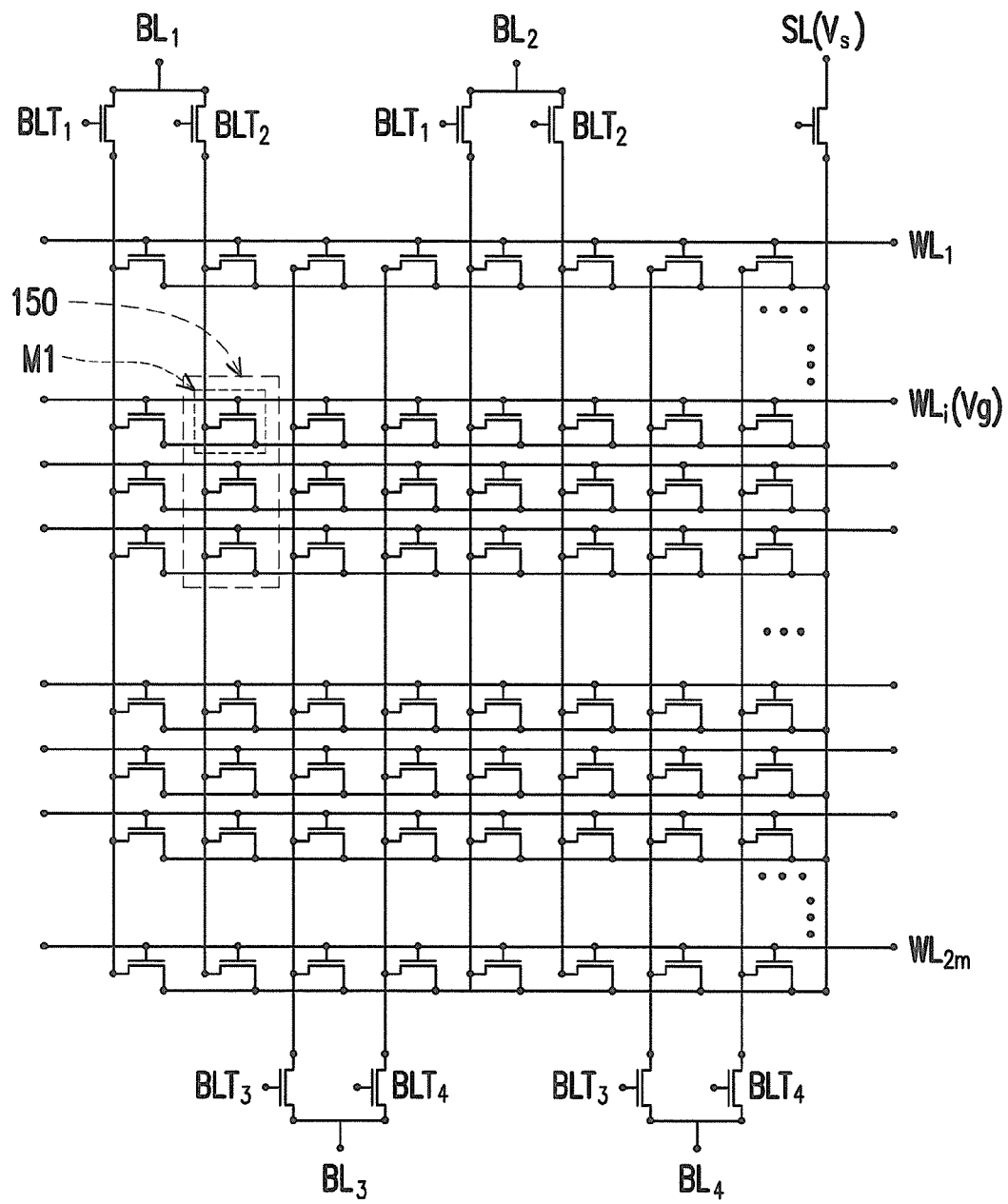
FIG. 15 is a schematic view of a memory array structure according to the first embodiment of the invention.
Figure 16:
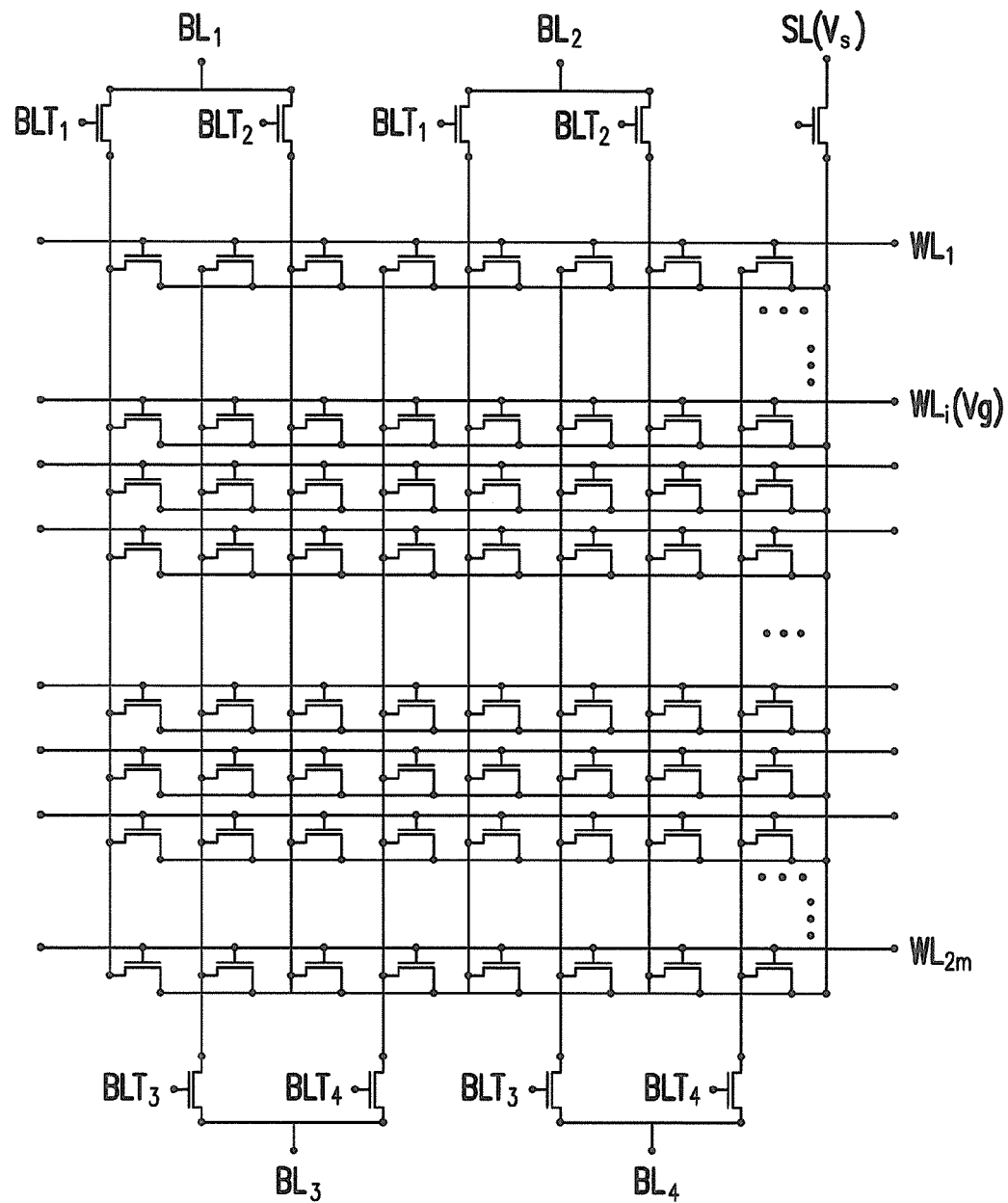
FIG. 16 is a schematic view of another memory array structure according to the first embodiment of the invention.

FIG. 15 is a schematic view of a memory array structure according to the first embodiment of the invention. FIG. 16 is a schematic view of another memory array structure according to the first embodiment of the invention.

With reference to FIG. 15, FIG. 15 illustrates a plurality of cell strings 150. The cell strings 150 are connected in series through a source line SL, a plurality of word lines $WL_1$ to $WL_{2m}$ (wherein m is an integer greater than 1), and a plurality of bit lines $BL_1$ to $BL_n$ (wherein n is an integer greater than 1) to be arranged in a memory array in a row direction and a column direction. The source line SL connects a source of each memory cell in the memory array in series, for example. The word lines $WL_1$, $WL_2$, ... $WL_{2m}$ respectively connect gates of the memory cells in series, for example. The bit lines $BL_1$, $BL_2$, ... $BL_n$ respectively connect drains of the memory cells in series, for example. In an embodiment, the bit lines $BL_1$ and $BL_2$ are respectively coupled to bit line transistors $BLT_1$ and $BLT_2$, and the bit lines $BL_3$ and $BL_4$ are respectively coupled to bit line transistors $BLT_3$ and $BLT_4$.

Each of the cell strings 150 may include 32 memory cells M1 or more memory cells. In an embodiment, different voltages are respectively applied to the source, the drain, and the gate corresponding to the memory cells M1, so as to perform an operation of reading, programming, or erasing. For example, first of all, a critical voltage $V_T$ is applied to the bit line transistor $BLT_1$ of the bit line $BL_1$ to turn on the bit line transistor $BLT_1$. Then, the drain voltage $V_d$ is applied to the memory cells M1 through the bit line $BL_1$, the source voltage $V_s$ is applied to the memory cells M1 through the source line SL, and the gate voltage $V_g$ is applied to the memory cells M1 through the word line $WL_i$.

With reference to FIG. 1 and FIG. 15, in an embodiment of the invention, two drains of each composite structure 80 may share a main bit line MBL (e.g., the bit line $BL_1$ of FIG. 15). Thus, when a voltage is applied to the bit line $BL_1$, only one of the drains of the composite structure 80 is selected through the bit line transistor $BLT_1$ or $BLT_2$, and the unselected drain voltage is floating.

In contrast thereto, with reference to FIG. 1 and FIG. 16, in the memory array structure, two drains of each composite structure 80 are connected with different main bit lines MBL (e.g., the bit lines $BL_1$ and $BL_3$ of FIG. 16). Thus, when a voltage is applied to the bit line $BL_1$, different drains of the composite structure 80 can be selected through the bit line transistor $BLT_1$ or $BLT_2$. That is to say, the two drains of the same composite structure 80 can be selected simultaneously and have different voltages. For example, when a voltage is applied to the bit lines $BL_1$ and $BL_3$, the two drains of the same composite structure 80 can be selected respectively through the bit line transistors $BLT_1$ and $BLT_3$.

Figure 17:
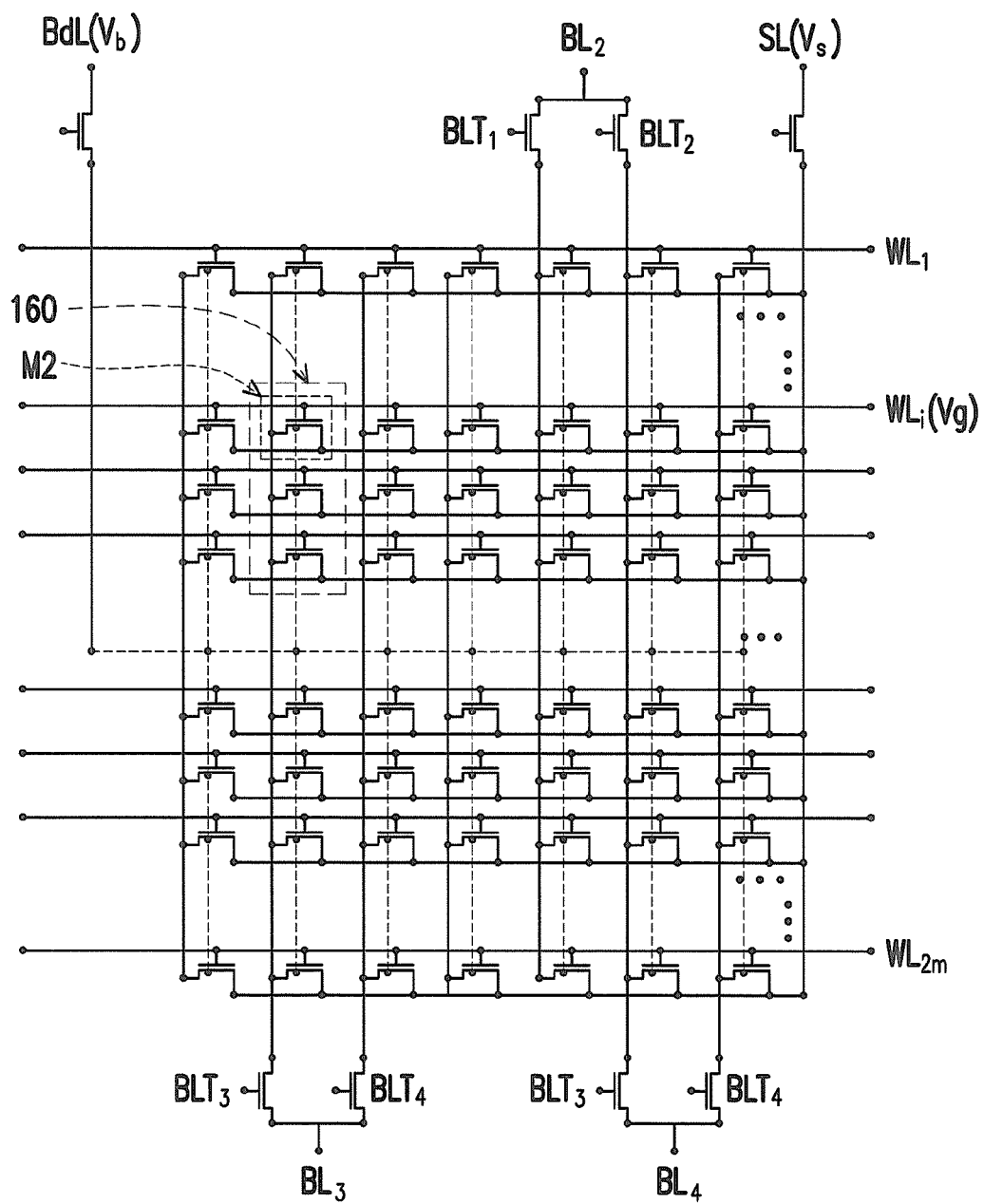
FIG. 17 is a schematic view of a memory array structure according to the second embodiment of the invention.
Figure 18:
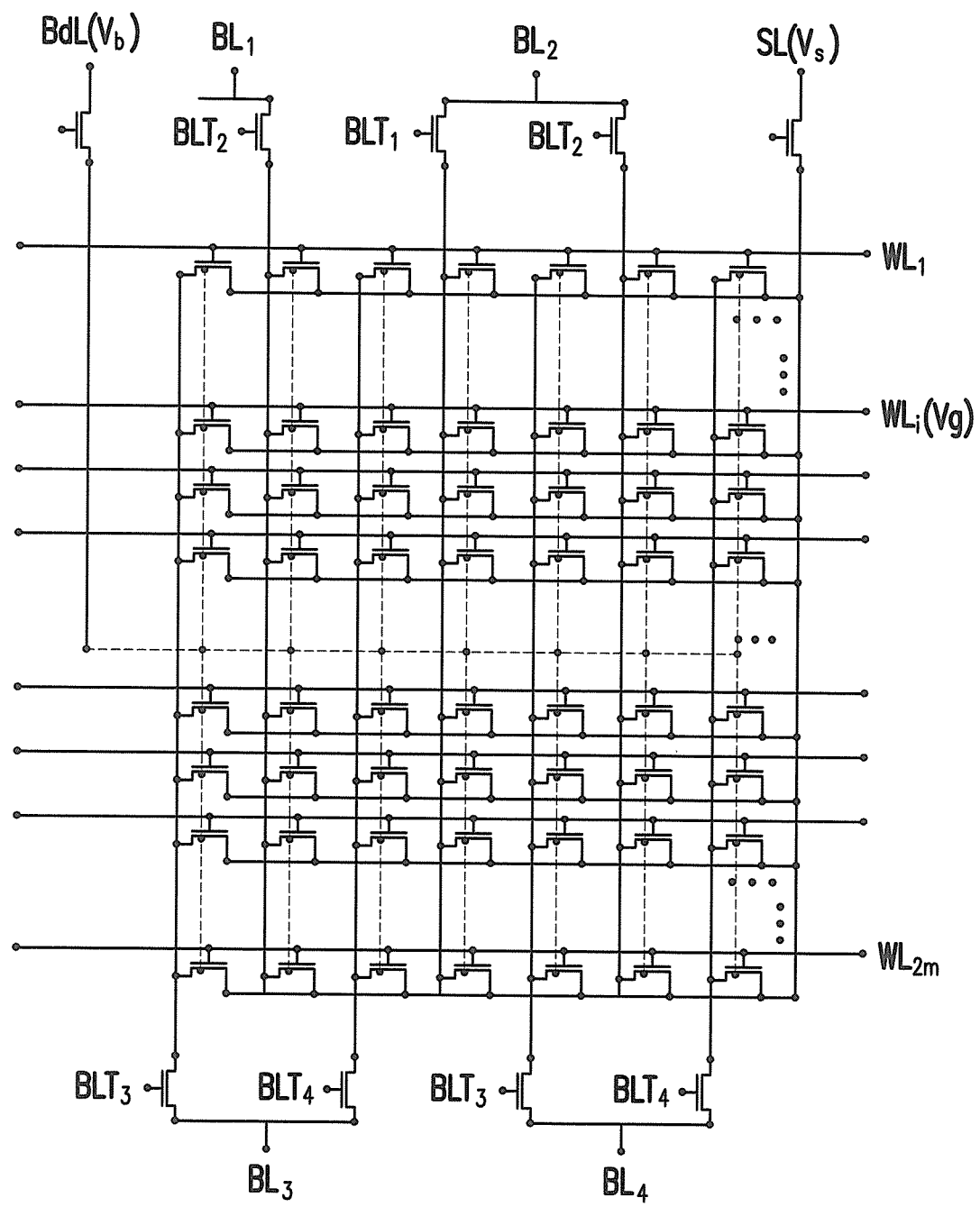
FIG. 18 is a schematic view of another memory array structure according to the second embodiment of the invention.

FIG. 17 is a schematic view of a memory array structure according to the second embodiment of the invention. FIG. 18 is a schematic view of another memory array structure according to the second embodiment of the invention.

With reference to FIG. 4 and FIG. 17, FIG. 17 illustrates a plurality of cell strings 160. Each of the cell strings 160 may include 32 memory cells M2 or more memory cells. The cell strings 160 are connected in series through a body line BdL, a plurality of bit lines $BL_1$ to $BL_n$ (wherein n is an integer greater than 1), a source line SL, and a plurality of word lines $WL_1$ to $WL_{2m}$ (wherein m is an integer greater than 1) to be arranged in a memory array in the row direction and the column direction. It should be noted that, as compared with the first embodiment, the body line BdL of this embodiment may connect a body of each memory cell in the memory array in series. That is to say, in addition to applying the drain voltage $V_d$, the source voltage $V_s$, and the gate voltage $V_g$, this embodiment further includes applying a body voltage $V_b$ to the memory cells through the body line BdL for controlling a potential of the body. Moreover, in this embodiment, two drains of each composite structure 80 share one main bit line MBL.

With reference to FIG. 4 and FIG. 18, in the memory array structure, two drains of each composite structure 80 are connected with different main bit lines MBL (e.g., the bit lines $BL_2$ and $BL_4$ of FIG. 18). Thus, when a voltage is applied to the bit line $BL_2$, drains of the different composite structures 80 are selected through the bit line transistor $BLT_1$ or $BLT_2$. That is to say, the two drains of the same composite structure 80 can be selected simultaneously and have different voltages.

Furthermore, the memory cells M1 and M2 may be read, programmed, or erased by various methods. For example, a method of reading the memory cells M1 and M2 includes reverse reading (RR). Alternatively, the memory cells M1 and M2 may be programmed by channel hot electron injection (CHEI) or band-to-band tunneling induced hot hole injection (BTBT HH). In addition, the erasing operation of the memory cells M1 and M2 may be performed by BTBT HH, FN electron injection, or FN hole injection. Table 1 shows three operational conditions for reading, programming, and erasing memory cells. However, it should be noted that the invention is not limited thereto.

TABLE 1

|  | operational condition 1 | operational condition 2 | operational condition 3 |
| --- | --- | --- | --- |
| reading | RR | RR | RR |
| programming | CHEI | CHEI | BTBT HH |
| erasing | BTBT HH | FN hole injection | FN electron injection |

Provided below are exemplary embodiments that respectively embody the operations of the aforementioned RR, CHEI, and BTBT HH on the two memory array structures as shown in FIG. 15 and FIG. 16. In addition, the following paragraphs provide examples explaining the operation methods of FN hole injection and FN electron injection. It should be understood that the scope of the invention is not limited to the operation methods and operating voltages specified below.

Figures 19A, 19B:
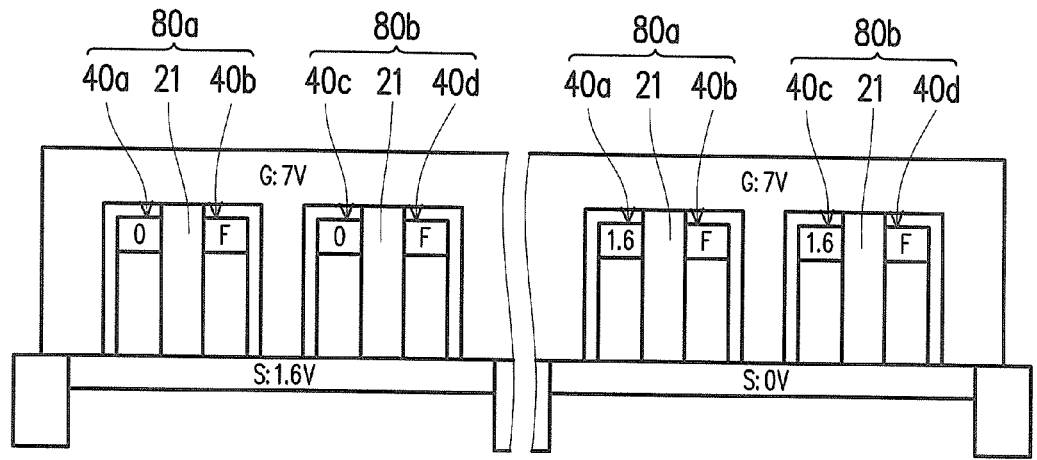
FIG. 19A to FIG. 19B are schematic views of a memory device performing a reverse reading (RR) operation with the memory array structure of FIG. 15.

FIG. 19A to FIG. 19B are schematic views of a memory device performing a reverse reading (RR) operation with the memory array structure of FIG. 15. FIG. 19A and FIG. 19B respectively illustrate reading the top bit and the bottom bit.

With reference to FIG. 15, FIG. 19A, and FIG. 19B, a drain of a semiconductor fin structure 40a is connected with the bit line transistor $BLT_1$ of the bit line $BL_1$; a semiconductor fin structure 40b is connected with the bit line transistor $BLT_2$ of the bit line $BL_1$; a drain of a semiconductor fin structure 40c is connected with the bit line transistor $BLT_3$ of the bit line $BL_3$; and a semiconductor fin structure 40d is connected with the bit line transistor $BLT_4$ of the bit line $BL_3$, for example. Operating voltages of the source line SL, the bit lines $BL_1$, $BL_2$, $BL_3$, and $BL_4$, and the bit line transistors $BLT_1$, $BLT_2$, $BLT_3$, and $BLT_4$ are shown in Table 2.

TABLE 2

|  | $BL_1$ | $BL_3$ | $BL_2$ | $BL_4$ | $BLT_1$ | $BLT_2$ | $BLT_3$ | $BLT_4$ | SL |
|---|---|---|---|---|---|---|---|---|---|
| top bit | 0 V | 0 V | 0 V | 0 V | 9 V | 0 V | 9 V | 0 V | 1.6 V |
| bottom bit | 1.6 V | 1.6 V | 1.6 V | 1.6 V | 9 V | 0 V | 9 V | 0 V | 0 V |

With reference to Table 2, FIG. 19A, and FIG. 19B, the operational condition of reading the top bit for example includes: applying a reading bias to the source end (the source voltage $V_s=1.6V$) and the gate end (the gate voltage $V_g=7V$), and applying a bias (the drain voltage $V_d=0V$) to the drain ends of the selected semiconductor fin structures 40a and 40c for sensing charges on the drain-side junction. Here, the drain voltages $V_d$ of the unselected semiconductor fin structures 40b and 40d are floating (F). In contrast thereto, as shown in FIG. 19B, the operational condition of reading the bottom bit for example includes: applying the reading bias to the drain end (the drain voltage $V_d=1.6V$) for sensing charges on the source-side junction. In addition, although the body voltage $V_b$ is floating in the above operational condition, the invention is not limited thereto. For example, the body voltage $V_b$ may be 0V if the memory device has the structure shown in FIG. 4.

Figures 20A, 20B:
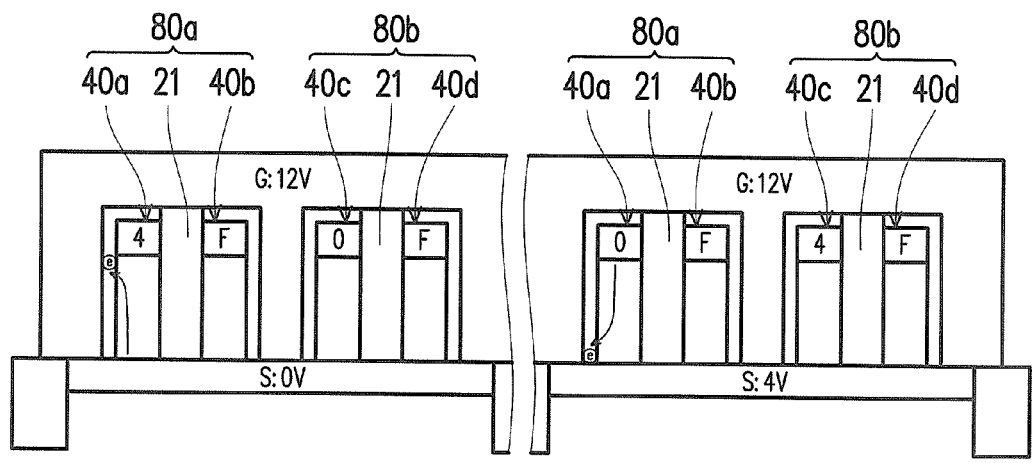
FIG. 20A to FIG. 20B are schematic views of a memory device performing a channel hot electron injection (CHEI) operation with the memory array structure of FIG. 15.

FIG. 20A to FIG. 20B are schematic views of a memory device performing a channel hot electron injection (CHEI) operation with the memory array structure of FIG. 15. FIG. 20A and FIG. 20B respectively represent programming the top bit and the bottom bit. Operating voltages of the source line SL, the bit lines $BL_1$, $BL_2$, $BL_3$, and $BL_4$, and the bit line transistors $BLT_1$, $BLT_2$, $BLT_3$, and $BLT_4$ are shown in Table 3.

TABLE 3

|  | $BL_1$ | $BL_3$ | $BL_2$ | $BL_4$ | $BLT_1$ | $BLT_2$ | $BLT_3$ | $BLT_4$ | SL |
|---|---|---|---|---|---|---|---|---|---|
| top bit | 4 V | 0 V | 0 V | 4 V | 9 V | 0 V | 9 V | 0 V | 0 V |
| bottom bit | 0 V | 4 V | 4 V | 0 V | 9 V | 0 V | 9 V | 0 V | 4 V |

With reference to Table 3, FIG. 20A, and FIG. 20B, the operational condition of programming the top bit for example includes: applying a gate voltage $V_g=12V$ to turn on the channel, and simultaneously applying a source voltage $V_s=0V$ and a body voltage $V_b=0V/F$ and respectively applying middle-level drain voltages $V_d=4V$ and $V_d=0V$ to the selected semiconductor fin structures 40a and 40c, so as to form an electric field from the source to the drain. The drain voltages $V_d$ of the unselected semiconductor fin structures 40b and 40d are floating (F). When the bias between the source and the drain is quite large, excessive hot electrons are generated on the channel, and a portion of the hot electrons enter the gate for programming. In contrast thereto, as shown in FIG. 20B, the operational condition of programming the bottom bit includes: applying a middle-level source voltage $V_s=4V$, and respectively applying drain voltages $V_d=0V$ and $V_d=4V$ to the selected semiconductor fin structures 40a and 40c, so as to form an electric field from the drain to the source. It should be noted that, when programming the top bit, the drain voltages $V_d=4V$ and $V_d=0V$ respectively represent programming and non-programming (inhibit); and when programming the bottom bit, the drain voltages $V_d=0V$ and $V_d=4V$ respectively represent programming and non-programming (inhibit).

Figures 21A, 21B:
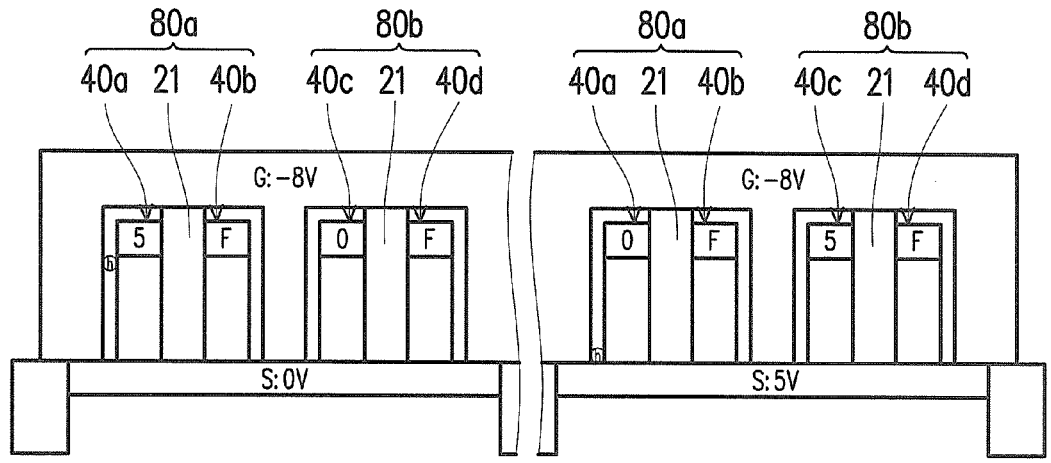
FIG. 21A to FIG. 21B are schematic views of a memory device performing a band-to-band tunneling induced hot hole injection (BTBT HH) operation with the memory array structure of FIG. 15.

FIG. 21A to FIG. 21B are schematic views of a memory device performing a band-to-band tunneling induced hot hole injection (BTBT HH) operation with the memory array structure of FIG. 15. FIG. 21A and FIG. 21B respectively represent erasing the top bit and the bottom bit. Operating voltages of the source line SL, the bit lines $BL_1$, $BL_2$, $BL_3$, and $BL_4$, and the bit line transistors $BLT_1$, $BLT_2$, $BLT_3$, and $BLT_4$ are shown in Table 4.

TABLE 4

|  | $BL_1$ | $BL_3$ | $BL_2$ | $BL_4$ | $BLT_1$ | $BLT_2$ | $BLT_3$ | $BLT_4$ | SL |
|---|---|---|---|---|---|---|---|---|---|
| top bit | 5 V | 0 V | 0 V | 5 V | 9 V | 0 V | 9 V | 0 V | 0 V |
| bottom bit | 0 V | 5 V | 5 V | 0 V | 9 V | 0 V | 9 V | 0 V | 5 V |

With reference to Table 4, FIG. 21A, and FIG. 21B, the operational condition of erasing the top bit for example includes: applying a gate voltage $V_g=-8V$, and simultaneously applying a source voltage $V_s=0V$ and a body voltage $V_b=0V/F$ and respectively applying drain voltages $V_d=5V$ and $V_d=0V$ to the selected semiconductor fin structures 40a and 40c. Under such a bias condition, charged carriers are injected to the charge storage layer by BTBT HH for erasing the top bit. In contrast thereto, with reference to FIG. 21B, the operational condition of erasing the bottom bit includes: applying a source voltage $V_s=5V$, and respectively applying drain voltages $V_d=0V$ and $V_d=5V$ to the selected semiconductor fin structures 40a and 40c.

It should be noted that, because the aforementioned operations of RR, CHEI, and BTBT HH are all performed on the memory array structure of FIG. 15, the two drains of each composite structure 80 share one main bit line MBL. In other words, in two adjacent composite structures 80a and 80b, the aforementioned operations may take place simultaneously on the semiconductor fin structures 40a and 40c, or the semiconductor fin structures 40b and 40d. That is, only one memory cell in each composite structure performs the operation. Accordingly, mutual influence between neighboring memory cells is prevented to improve the second bit effect of the memory device.

Figures 22A, 22B:
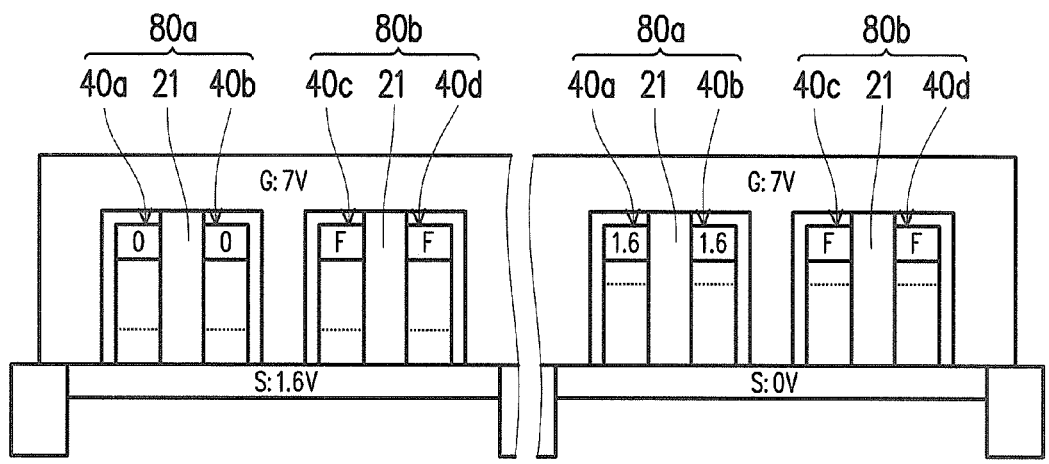
FIG. 22A to FIG. 22B are schematic views of a memory device performing a reverse reading (RR) operation with the memory array structure of FIG. 16.

FIG. 22A to FIG. 22B are schematic views of a memory device performing a reverse reading (RR) operation with the memory array structure of FIG. 16. FIG. 22A and FIG. 22B respectively represent reading the top bit and the bottom bit.

With reference to FIG. 16, FIG. 22A, and FIG. 22B, the drain of the semiconductor fin structure 40a is connected with the bit line transistor $BLT_1$ of the bit line $BL_1$; the semiconductor fin structure 40c is connected with the bit line transistor $BLT_2$ of the bit line $BL_1$; the drain of the semiconductor fin structure 40b is connected with the bit line transistor $BLT_3$ of the bit line $BL_3$; and the semiconductor fin structure 40d is connected with the bit line transistor $BLT_4$ of the bit line $BL_3$, for example. The operating voltages of the source line SL, the bit lines $BL_1$, $BL_2$, $BL_3$, and $BL_4$, and the bit line transistors $BLT_1$, $BLT_2$, $BLT_3$, and $BLT_4$ are as shown in the above Table 2.

With reference to Table 2, FIG. 22A, and FIG. 22B, the operational condition of reading the top bit for example includes: applying a reading bias to the source end (the source voltage $V_s=1.6V$) and the gate end (the gate voltage $V_g=7V$), and applying a bias (the drain voltage $V_d=0V$) to the drain ends of the selected semiconductor fin structures 40a and 40b for sensing charges on the drain-side junction. Here, the drain of the unselected semiconductor fin structures 40c and 40d are floating (F). When reading the bottom bit, as shown in FIG. 22B, the operational condition for example includes: applying a reading bias to the drain end (the drain voltage $V_d=1.6V$) for sensing charges on the source-side junction. It should be noted that, when reading the top bit, a depletion edge (as illustrated by the dotted lines in FIG. 22A) that substantially has no carrier appears in the body near the source; and when reading the bottom bit, the depletion edge appears in the body near the drain.

Figures 23A, 23B:
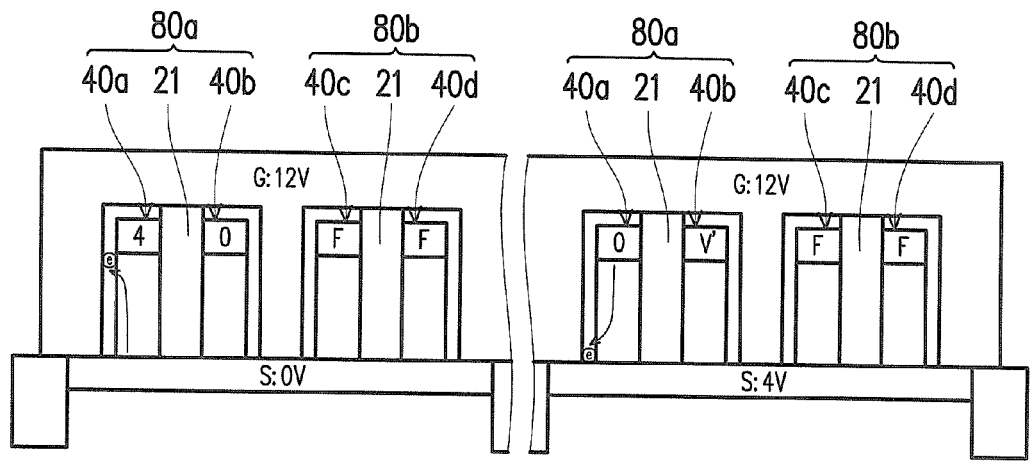
FIG. 23A to FIG. 23B are schematic views of a memory device performing the channel hot electron injection (CHEI) operation with the memory array structure of FIG. 16.

FIG. 23A to FIG. 23B are schematic views of a memory device performing a channel hot electron injection (CHEI) operation with the memory array structure of FIG. 16. FIG. 23A and FIG. 23B respectively represent programming the top bit and the bottom bit. Operating voltages of the source line SL, the bit lines $BL_1$, $BL_2$, $BL_3$, and $BL_4$, and the bit line transistors $BLT_1$, $BLT_2$, $BLT_3$, and $BLT_4$ are shown in Table 5.

TABLE 5

|  | $BL_1$ | $BL_3$ | $BL_2$ | $BL_4$ | $BLT_1$ | $BLT_2$ | $BLT_3$ | $BLT_4$ | SL |
|---|---|---|---|---|---|---|---|---|---|
| top bit | 4 V | 0 V | 0 V | 4 V | 9 V | 0 V | 9 V | 0 V | 0 V |
| bottom bit | 0 V | V' | V' | 0 V | 9 V | 0 V | 9 V | 0 V | 4 V |

With reference to Table 5 and FIG. 23A, the operational condition of programming the top bit for example includes: applying a gate voltage $V_g=12V$ to turn on the channel, and simultaneously applying a source voltage $V_s=0V$ and a body voltage $V_b=0V/F$ and respectively applying middle-level drain voltages $V_d=4V$ and $V_d=0V$ to the selected semiconductor fin structures 40a and 40b, so as to form an electric field from the source to the drain. The drain of the unselected semiconductor fin structures 40c and 40d are floating (F). When the bias between the source and the drain is quite large, excessive hot electrons are generated on the channel, and a portion of the hot electrons enter the gate for programming.

When programming the bottom bit, as shown in FIG. 23B, the operational condition includes: applying a middle-level source voltage $V_s=4V$, and respectively applying drain voltages $V_d=0V$ and $V_d=V'$ to the selected semiconductor fin structures 40a and 40b so as to form an electric field from the drain to the source. It should be noted that the V' (non-programmed bias) may be an independent bias. That is, a bias of V' can be selected at will. However, when V' is too high, the other drain (e.g., the drain of the semiconductor fin structure 40a) of the same composite structure 80a may have leakage; and in contrast, program disturbance may occur when V' is too low. In an embodiment, V' is 1V-2V, for example. In addition, when programming the top bit, the drain voltages $V_d=4V$ and $V_d=0V$ respectively represent programming and non-programming; and when programming the bottom bit, the drain voltages $V_d=0V$ and $V_d=V'$ respectively represent programming and non-programming.

Figures 24A, 24B:
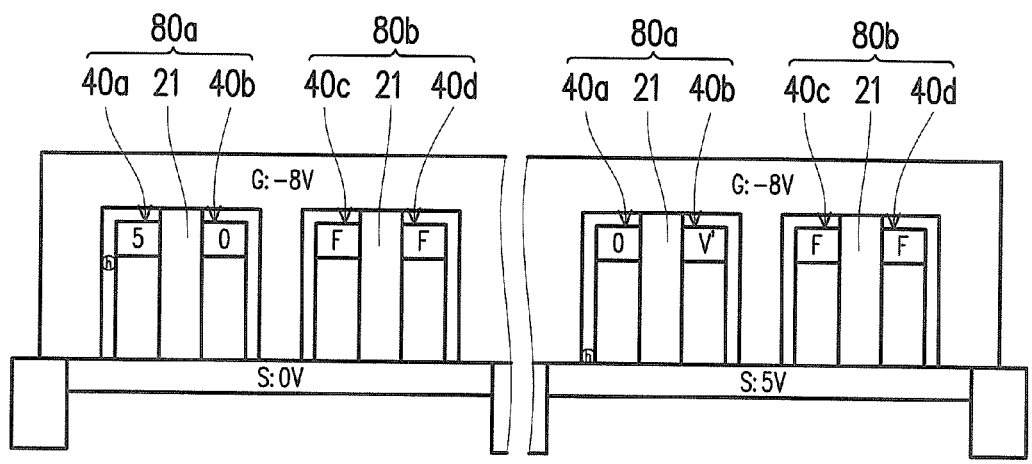
FIG. 24A to FIG. 24B are schematic views of a memory device performing the band-to-band tunneling induced hot hole injection (BTBT HH) operation with the memory array structure of FIG. 16.

FIG. 24A to FIG. 24B are schematic views of a memory device performing a band-to-band tunneling induced hot hole injection (BTBT HH) operation with the memory array structure of FIG. 16. FIG. 24A and FIG. 24B respectively represent erasing the top bit and the bottom bit. Operating voltages of the source line SL, the bit lines $BL_1$, $BL_2$, $BL_3$, and $BL_4$, and the bit line transistors $BLT_1$, $BLT_2$, $BLT_3$, and $BLT_4$ are shown in Table 6.

TABLE 6

|  | $BL_1$ | $BL_3$ | $BL_2$ | $BL_4$ | $BLT_1$ | $BLT_2$ | $BLT_3$ | $BLT_4$ | SL |
|---|---|---|---|---|---|---|---|---|---|
| top bit | 5 V | 0 V | 0 V | 5 V | 9 V | 0 V | 9 V | 0 V | 0 V |
| bottom bit | 0 V | V''' | V''' | 0 V | 9 V | 0 V | 9 V | 0 V | 5 V |

With reference to Table 6, FIG. 24A, and FIG. 24B, the operational condition of erasing the top bit for example includes: applying a gate voltage $V_g=-8V$, and simultaneously applying a source voltage $V_s=0V$ and a body voltage $V_b=0V/F$ and respectively applying drain voltages $V_d=5V$ and $V_d=0V$ to the selected semiconductor fin structures 40a and 40b. Under such a bias condition, charged carriers are injected to the charge storage layer by BTBT HH for erasing the top bit. In contrast thereto, with reference to FIG. 24B, the operational condition of erasing the bottom bit includes: applying a source voltage $V_s=5V$, and respectively applying drain voltages $V_d=0V$ and $V_d=V'''$ to the selected semiconductor fin structures 40a and 40b. It should be noted that the V''' (non-programmed bias) may be an independent bias. In an embodiment, the V''' is 0V-5V, for example. In another embodiment, the V''' is 2.5V, for example.

It should be noted that, because the aforementioned operations of RR, CHEI, and BTBT HH are all performed on the memory array structure of FIG. 16, the two drains of each composite structure 80 are connected with different main bit lines MBL. Therefore, two memory cells of the same composite structure can perform the operation simultaneously. Because of the dielectric layer disposed between the two memory cells, the invention prevents interference between neighboring memory cells and thereby improves the second bit effect of the memory device.

Figures 25A, 25B:
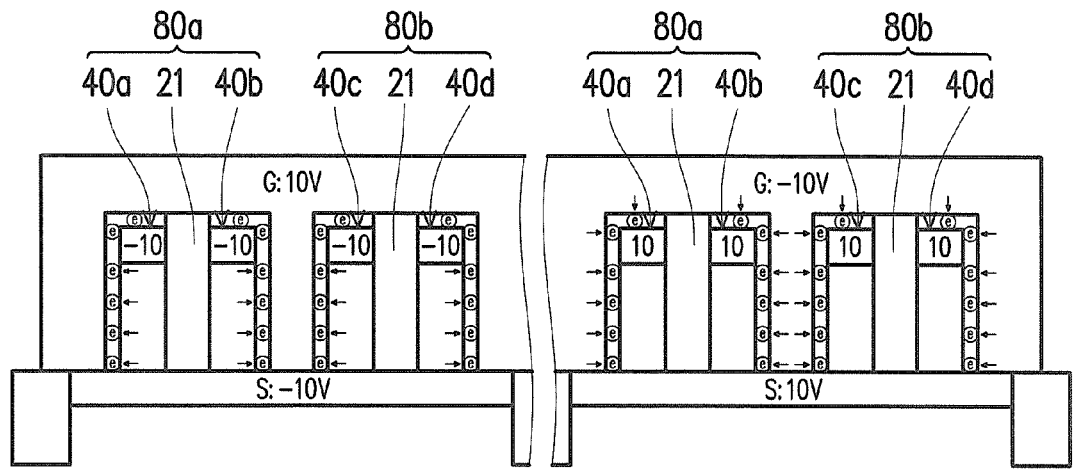
FIG. 25A to FIG. 25B are schematic views illustrating a memory device of an FN electron injection operation according to the first embodiment of the invention.
Figures 26A, 26B:
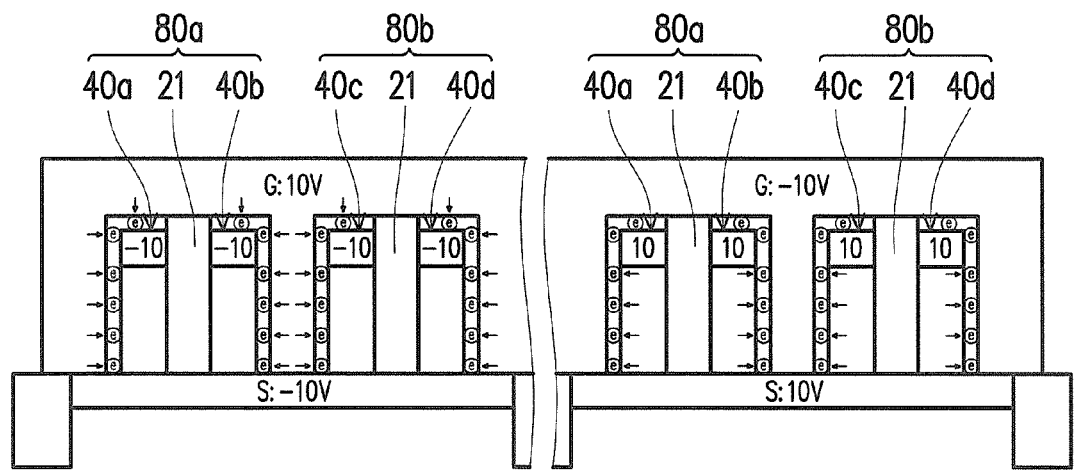
FIG. 26A to FIG. 26B are schematic views illustrating a memory device of an FN hole injection operation according to the first embodiment of the invention.

FIG. 25A to FIG. 25B are schematic views illustrating a memory device of an FN electron injection operation according to the first embodiment of the invention. FIG. 26A to FIG. 26B are schematic views illustrating a memory device of an FN hole injection operation according to the first embodiment of the invention.

With reference to FIG. 25A, the erasing operation performed by +FN electron injection for example includes: injecting electrons from the semiconductor fin structures 40a, 40b, 40c, and 40d to the charge storage layer on one side. The operational condition thereof for example includes: applying a gate voltage $V_g=10V$, and simultaneously applying a drain voltage $V_d=-10V$, a source voltage $V_s=-10V$, and a body voltage $V_b=-10V$ or floating to form a larger electric field between the source and the drain and the gate, such that electrons in the body and the drain enter the charge storage layer through an FN tunneling effect for erasing data. In contrast thereto, with reference to FIG. 25B, the erasing operation performed by −FN electron injection for example includes: injecting electrons from the gate to the charge storage layer. The operational condition thereof for example includes: applying a gate voltage $V_g=-10V$, and simultaneously applying a drain voltage $V_d=10V$, a source voltage $V_s=10V$, and a body voltage $V_b=10V$ or floating to inject electrons from the gate to the charge storage layer.

With reference to FIG. 26A, the erasing operation performed by +FN hole injection for example includes: injecting holes from the gate to the charge storage layer. The operational condition thereof for example includes: applying a gate voltage $V_g=10V$, and simultaneously applying a drain voltage $V_d=-10V$, a source voltage $V_s=-10V$, and a body voltage $V_b=-10V$ or floating, so as to form a larger electric field between the source and the gate and between the drain and the gate, such that holes in the gate enter the charge storage layer through the FN tunneling effect for erasing data. In contrast thereto, with reference to FIG. 26B, the erasing operation performed by −FN hole injection for example includes: injecting holes from the body and the drain to the charge storage layer. The operational condition thereof for example includes: applying a gate voltage $V_g=-10V$, and simultaneously applying a drain voltage $V_d=10V$, a source voltage $V_s=10V$, and a body voltage $V_b=10V$ or floating, such that holes in the body and the drain enter the charge storage layer through the FN tunneling effect for erasing data.

In addition to erasing data of a memory, the operations of the aforementioned FN hole injection and FN electron injection can be used to adjust a threshold voltage (Vt) to a desired target value before performing the programming or erasing operation on the memory cells if the threshold voltage does not reach the desired value due to process variation or other reasons. In an embodiment, the threshold voltage may be increased by FN electron injection. In another embodiment, the threshold voltage may be decreased by FN hole injection.

To conclude the above, the memory device of the invention includes the composite structure. In the composite structure, the dielectric layer is disposed between two semiconductor fin structures, such that the charge storage layer covering the composite structure is on one side of each semiconductor fin structure. Accordingly, interference between two memory cells in the composite structure can be prevented during operation to significantly improve the second bit effect of the vertical memory device and maintain the operational performance. Furthermore, the sources of the semiconductor fin structures are electrically connected with each other, so as to facilitate connection between internal elements of the vertical memory device and simplify the fabrication of the vertical memory device.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A memory device, comprising:
   a substrate;
   a first doped region disposed on a surface of the substrate;
   a plurality of composite structures disposed on the first doped region, and each of the composite structures comprising:
   two semiconductor fin structures each comprising a second doped region at an upper portion of the semiconductor fin structure, and a body region disposed between the second doped region and the first doped region; and
   a dielectric layer disposed between the semiconductor fin structures;
   a plurality of word lines disposed on the substrate and each covering a portion of a sidewall and a portion of a top of each of the composite structures;
   a charge storage layer disposed between the composite structures and the word lines;
   a first barrier layer disposed between the second doped region and the body region; and
   a second barrier layer disposed between the body region and the first doped region.

2. The memory device according to claim 1, wherein the charge storage layer is disposed on a side of each of the semiconductor fin structures.

3. The memory device according to claim 1, wherein first doped region further extends to each of the semiconductor fin structures.

4. The memory device according to claim 1, further comprising:
   a plurality of first contacts disposed on a first portion of the substrate, wherein each of the first contacts is electrically connected with the corresponding second doped region; and
   a plurality of second contacts disposed on a second portion of the substrate, wherein each of the second contacts is electrically connected with the first doped region.

5. The memory device according to claim 1, wherein the first doped region and the second doped region are a first conductivity type, and the body region is a second conductivity type, wherein the first conductivity type and the second conductivity type are different.

6. The memory device according to claim 1, wherein each of the composite structures extends in a first direction and each of the word lines extends in a second direction, wherein the first direction and the second direction are different.

7. The memory device according to claim 1, wherein:
   a trench is disposed in a first portion of the substrate, wherein the trench extends in the second direction and exposes a portion of the body regions; and
   a third contact is disposed in the trench and electrically connected with the portion of the body regions exposed by the trench.

8. A fabricating method of a memory device, the fabricating method comprising:
   providing a substrate;
   forming a plurality of composite structures on the substrate, wherein each of the composite structures comprises two semiconductor fin structures and a dielectric layer, and the dielectric layer is disposed between the semiconductor fin structures, wherein each of the semiconductor fin structures comprises a second doped region and a body region, wherein a method of forming the composite structures comprises:
   forming the semiconductor fin structures on the substrate;
   forming the dielectric layers on the substrate; and
   removing a portion of the dielectric layers to form the composite structures, wherein a method of removing the portion of the dielectric layers comprises:
   forming a patterned mask layer to cover a portion of the dielectric layers and a portion of the semiconductor fin structures; and
   removing the dielectric layers not covered by the patterned mask layer;
   forming a first doped region on a surface of the substrate, wherein the first doped region is connected with each of the semiconductor fin structures;
   forming a plurality of word lines on the substrate, wherein each of the word lines covers a portion of a sidewall and a portion of a top of each of the composite structures; and
   forming a charge storage layer between the composite structures and the word lines.

9. The fabricating method according to claim 8, wherein a method of forming the semiconductor fin structures comprises:
   forming a doped layer on the substrate; and
   patterning the doped layer and the substrate to form the semiconductor fin structures.

10. The fabricating method according to claim 9, further comprising:
    forming a hard mask layer on the doped layer and forming a patterned mask layer on the hard mask layer before patterning the doped layer and the substrate; and
    patterning the hard mask layer, the doped layer, and the substrate with the patterned mask layer as a mask to form a plurality of patterned hard mask layers, a plurality of second doped regions, and a plurality of body regions.

11. The fabricating method according to claim 10, wherein a method of forming the first doped region comprises:
    performing an ion implantation process on the substrate with the patterned hard mask layers as masks to implant a dopant in the substrate and form the first doped region.

12. The fabricating method according to claim 8, further comprising:

forming a plurality of first contacts on a first portion of the substrate, wherein each of the first contacts is electrically connected with the corresponding second doped region; and forming a plurality of second contacts on a second portion of the substrate, wherein each of the second contacts is electrically connected with the first doped region.

13. The fabricating method according to claim 12, further comprising:

forming a plurality of isolation structures in the second portion of the substrate; and forming a third doped region in the substrate between the isolation structures, wherein the third doped region is electrically connected with the first doped region, wherein each of the second contacts is electrically connected with the first doped region through the third doped region.

14. The fabricating method according to claim 8, wherein the method of forming the semiconductor fin structures comprises:

forming a stack layer on the substrate, wherein the stack layer comprises a first doped layer, a body layer, and a second doped layer from bottom to top; and patterning the body layer and the second doped region to form the semiconductor fin structures, wherein the first doped layer serves as the first doped region.

15. The fabricating method according to claim 14, wherein the stack layer further comprises a first barrier layer between the first doped layer and the body layer, and a second barrier layer between the body layer and the second doped layer.

* * * * *